United States Patent
Shiraishi et al.

(10) Patent No.: US 6,725,168 B2
(45) Date of Patent: Apr. 20, 2004

(54) VEHICLE/TIRE PERFORMANCE SIMULATING METHOD

(75) Inventors: Masaki Shiraishi, Kobe (JP); Naoaki Iwasaki, Kobe (JP)

(73) Assignee: Sumitomo Rubber Industries, Ltd., Hyogo (JP)

( * ) Notice: Subject to any disclaimer, the term of this patent is extended or adjusted under 35 U.S.C. 154(b) by 0 days.

(21) Appl. No.: 10/049,596

(22) PCT Filed: Jun. 13, 2001

(86) PCT No.: PCT/JP01/05015

§ 371 (c)(1),
(2), (4) Date: Apr. 2, 2002

(87) PCT Pub. No.: WO01/96128

PCT Pub. Date: Dec. 20, 2001

(65) Prior Publication Data

US 2002/0134149 A1 Sep. 26, 2002

(30) Foreign Application Priority Data

Jun. 14, 2000 (JP) .......................... 2000-178948

(51) Int. Cl.⁷ .......................... G01M 17/02; G06F 19/00
(52) U.S. Cl. .............................. 702/81; 702/41; 73/146; 701/41; 703/8
(58) Field of Search .............................. 702/41, 42, 81, 702/83, 84; 701/41; 73/146, 9, 8; 703/8; 156/110.1

(56) References Cited

U.S. PATENT DOCUMENTS

| | | | | |
|---|---|---|---|---|
| 5,488,555 A | * | 1/1996 | Asgari et al. | ................ 701/41 |
| 5,750,890 A | | 5/1998 | Fricke et al. | ................ 73/146 |
| 5,930,155 A | * | 7/1999 | Tohi et al. | ................ 703/8 |
| 6,134,957 A | * | 10/2000 | Fricke et al. | ................ 73/146 |
| 6,192,745 B1 | * | 2/2001 | Tang et al. | ................ 73/146 |
| 6,430,993 B1 | * | 8/2002 | Seta | ................ 73/146 |

FOREIGN PATENT DOCUMENTS

| | | |
|---|---|---|
| EP | 775902 A1 | 5/1997 |
| EP | 919941 A2 | 6/1999 |
| EP | 1030170 A1 | 8/2000 |
| EP | 1037030 A2 | 9/2000 |
| JP | 6-290225 A | 10/1994 |

* cited by examiner

*Primary Examiner*—John Barlow
*Assistant Examiner*—John Le
(74) *Attorney, Agent, or Firm*—Birch, Stewart, Kolasch & Birch, LLP

(57) ABSTRACT

A simulating method for vehicle/tire performances which includes: a tire model preparing step (s1) of preparing a tire model of a tire including a ply made out of a finite number of elements; a vehicle body model preparing step (s2) of preparing a vehicle body model of a vehicle body including suspension members made out of a finite number of elements; a vehicle model preparing step (s3) of preparing a vehicle model by attaching the tire model to a suspension model of the suspension members in the vehicle body model; and a simulation step (s4, s5) of virtually running the vehicle model by giving a boundary condition, and estimating vehicle's traveling properties and/or a tire property.

19 Claims, 25 Drawing Sheets

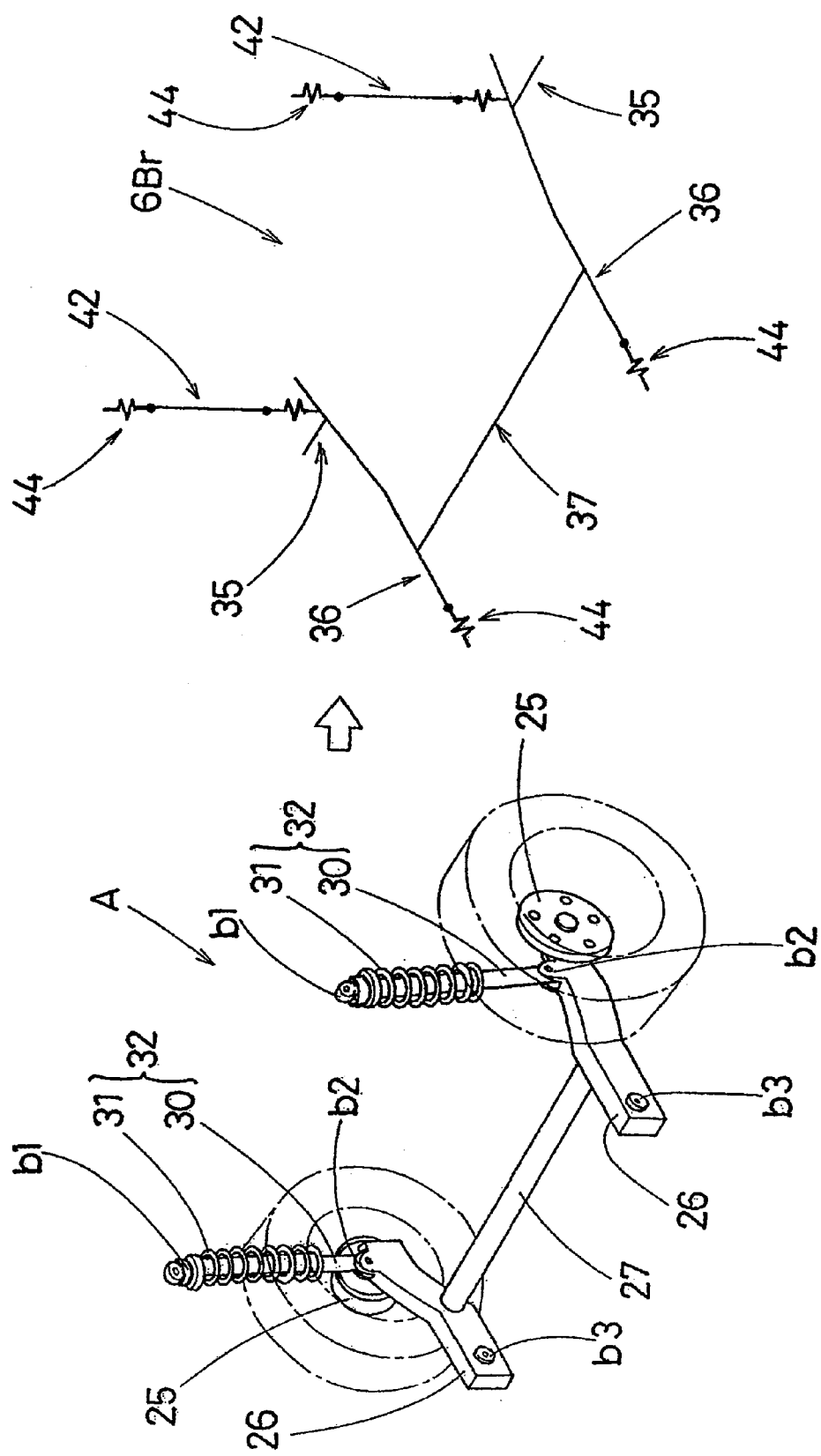

VEHICLE/TIRE PERFORMANCE SIMULATING METHOD

This application is the national phase under 35 U.S.C. §371 of PCT International Application No. PCT/JP01/05015 which has an International filing date of Jun. 13, 2001, which designated the United States of America.

TECHNICAL FIELD

The present invention relates to a simulating method for vehicle/tire performances that is useful for effectively developing a tire suitable for a vehicle.

BACKGROUND ART

In the case of developing a tire suitable for a specific vehicle, conventionally, a tire is actually made by way of trial and mounted on the vehicle and various kinds of evaluations such as sensory evaluation, instrumental evaluation and the like are made by actually running the vehicle. Further, the trial tire is subjected to laboratory tests using a drum tester for cornering property and the like. Then, according to the results thereof, the test model is improved and again subjected to the actual car evaluations by mounting it on the vehicle model. Thus, there are repeatedly made the actual car evaluations using the actual car.

However, in the conventional developing method in which the actual car evaluations are made, a lot of trouble and labor and much time are required because the tires must be actually made and it is necessary to prepare the vehicle used in the actual car test, a place for running the vehicle, measuring devices, operators therefor, a test driver and the like.

The present invention was therefore, made by taking the above mentioned problems into consideration, and an object thereof is to provide a simulating method for vehicle/tire performances, in which vehicle's traveling properties and/or tire properties can be estimated by running a vehicle model virtually by means of computer or the like, which vehicle model is obtained by modeling the vehicle's main body, suspension members, tires and the like by using elements which can be treated in a finite element method, and by which a tire suitable for the vehicle can be effectively developed for a short time.

DISCLOSURE OF THE INVENTION

In accordance with the present invention, a simulating method for vehicle/tire performances is characterized in that the method comprises: a tire model preparing step of preparing a tire model in which a tire, inclusive of a ply, is divided into a finite number of elements; a vehicle body model preparing step of preparing a vehicle body model in which a vehicle body, inclusive of suspension members, is divided into a finite number of elements; a vehicle model preparing step of preparing a vehicle model of the vehicle by attaching the tire model to a suspension model of the suspension members in the vehicle body model; and a simulation step of simulating traveling of the vehicle model under a given boundary condition and obtaining vehicle's traveling properties and/or a tire's property.

The above-mentioned vehicle's traveling properties may include at least one of the degree of understeer and oversteer, the vehicle's response speed to steering and the degree of the vehicle's roll. The above-mentioned suspension members include an arm, spring, shock absorber, torsion beam, stabilizer, link rod and rubber bush. The arm and link rod can be modeled by a rigid beam element. The spring, shock absorber and rubber bush can be modeled by a linear or non-linear spring element. The torsion beam and stabilizer can be modeled by a torsional beam element.

Further, a vibrating property of the vehicle body under 10 Hz may be included as one of the vehicle's traveling properties. In this case, it is desirable that the vehicle body model is a rigid model that does not deform.

Furthermore, a vibrating property of the vehicle body between 10 Hz and 100 Hz may be included as one of the vehicle's traveling properties. In this case, it is preferable that the vehicle body model exclusive of the suspension model is provided with a vibration mode substantially same as the vibration mode of the vehicle body to be estimated.

The traveling simulation is made by running the vehicle model on a road model of a road surface made by elements. For example, the road model can be made out of a rigid element and a water element for water thereon, whereby it is possible to estimate wet traveling properties as the above-mentioned vehicle's traveling properties.

Further, the road model can be made of a rigid element and a snow element for snow thereon, whereby it is possible to estimate on-the-snow traveling properties as the vehicle's traveling properties.

Furthermore, the road model can be made out of a rigid element and a mud element for mud thereon, whereby it is possible to estimate traveling properties on muddy roads as the vehicle's traveling properties.

Still furthermore, the road model can be made of a rigid element and a sand element for sand thereon, whereby it is possible to estimate traveling properties on sandy roads as the vehicle's traveling properties.

Incidentally, the road model may be defined as being entirely flat but it can include an uneven part, whereby it is possible to estimate ride comfort as the vehicle's traveling properties.

The above-mentioned vehicle model preparing step preferably includes: setting an internal pressure condition to the tire model under a gravitational condition of 0 G; and applying a load of the vehicle body model to the tire model by setting the gravitational condition to 1 G after setting the internal pressure condition to the tire model.

In the above-mentioned simulation step, it is possible to use the vehicle model having an initial speed v (not equal to zero). In this case, a speed corresponding to the translational component of the initial speed v is given to the vehicle body model, but given to the tire model are the translational component of the initial speed v and a speed corresponding to a rotational component.

Further, the above-mentioned traveling simulation may include a steady circling simulation in which the vehicle model circles with the steering angle of the tire model fixed. In this case, a steering property can be estimated on the basis of the turning radius of the vehicle model and/or the roll angle of the vehicle model which are obtained by the steady circling simulation as the vehicle's traveling properties.

Furthermore, the traveling simulation may include a lane change simulation in which the state at the time of a lane change is simulated. In this case, as one of the vehicle's traveling properties, a lane change property can be estimated on the basis of a behavior of the vehicle model and/or a convergence at a time of returning back the steering angle of the vehicle model, which are obtained by the lane change simulation.

Still furthermore, the traveling simulation may include a driving simulation in which a constant torque is applied to the tire model and a speed change of the vehicle model is observed. In this case, it is possible to estimate a driving force property as one of the vehicle's traveling properties.

Furthermore, the traveling simulation may include a braking simulation in which a constant braking force is applied to the tire model and a speed change of the vehicle model is observed. In this case, it is possible to estimate a braking force property as one of the vehicle's traveling properties.

BRIEF DESCRIPTION OF THE DRAWINGS

FIG. 6 is a conceptual diagram describing modeling of a suspension;

BEST MODE FOR CARRYING OUT THE INVENTION

An embodiment of the present invention will be described with reference to the accompanying drawings.

Figure 1:
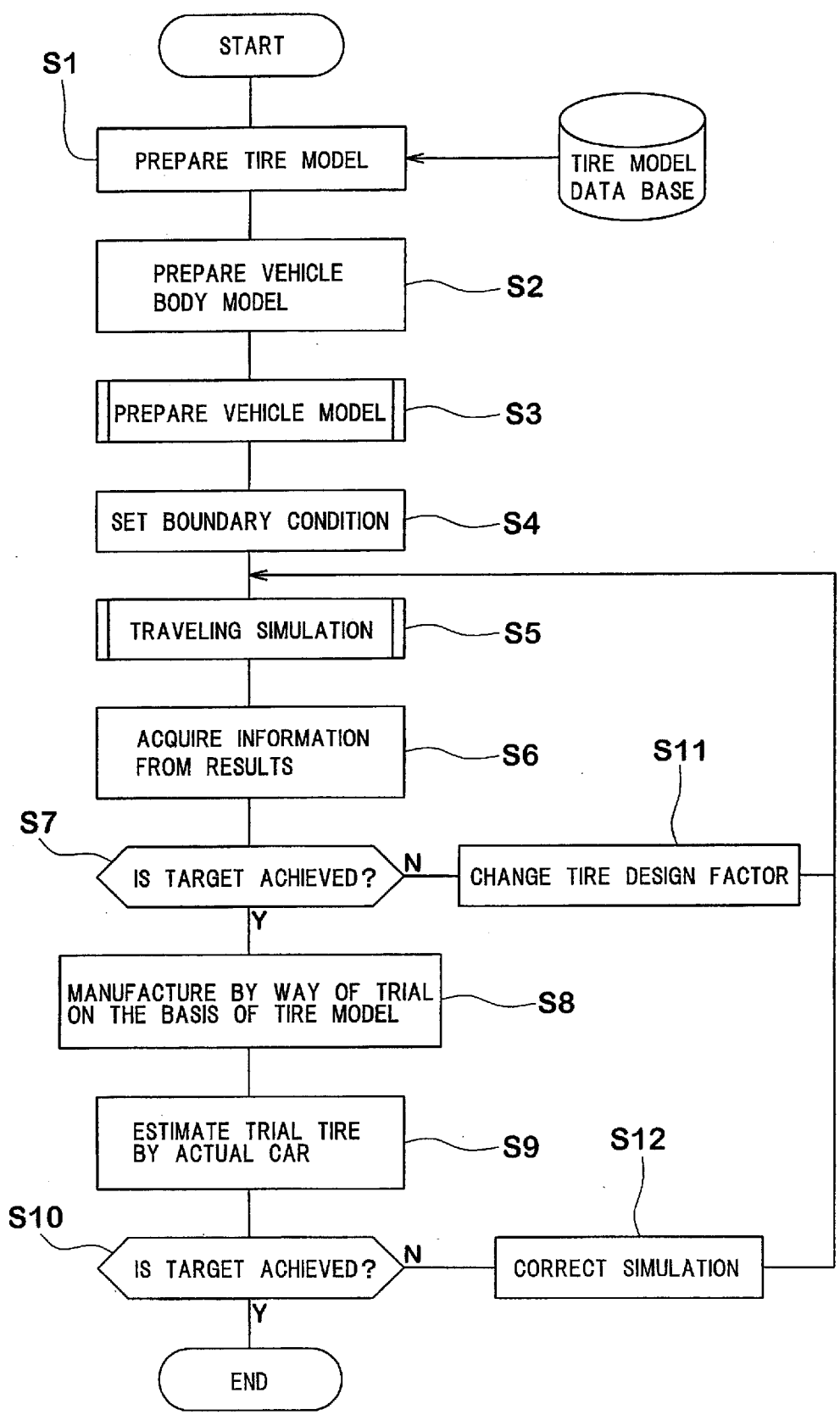
FIG. 1 is a flow chart showing an embodiment of the present invention.

FIG. 1 exemplarily shows a processing procedure in accordance with the simulating method for vehicle/tire performances of the present embodiment.

As shown in FIG. 1, the present simulating method comprises
- a tire model preparing step s1 of preparing a tire model of a tire inclusive of a ply made out of a finite number of elements,
- a vehicle body model preparing step s2 of preparing a vehicle body model of a vehicle body inclusive of suspension members made out of a finite number of elements,
- a vehicle model preparing step s3 of preparing a vehicle model by attaching the tire model to a suspension model of the suspension member in the vehicle body model,
- simulation steps s4 and s5 of executing a simulation of traveling of the vehicle model on the basis of a set boundary condition and getting information on vehicle's traveling properties and/or tire properties. These are described in order as follows.

At first, the tire model preparing step s1 is described.

Figure 2:
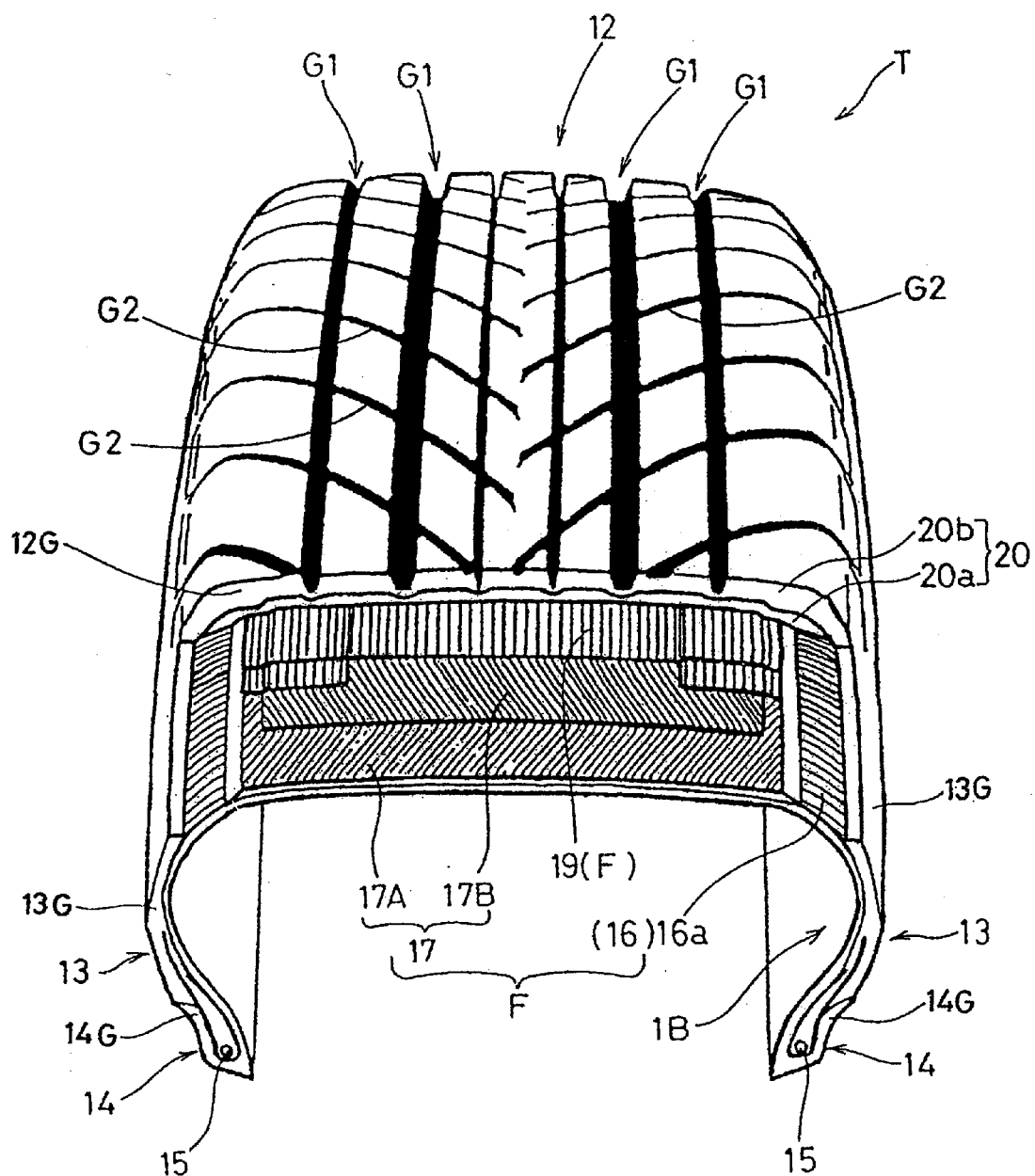
FIG. 2 is a cross sectional view showing an example of the tire being a subject of estimation.

In the present embodiment, there is made a model of a passenger car radial tire T having the structure shown in FIG. 2 (hereinafter, sometimes simply referred to as the "tire").

The tire T has a carcass 16 comprising a carcass ply 16a which extends from a tread portion 12 through a sidewall portion 13 and is folded back around a bead core 15 in a bead portion 14 and is made of cords inclined at substantially 90 degrees with respect to the tire circumferential direction, and a belt layer 17 disposed radially outside the carcass 16 in the tread portion 12.

The belt layer 17 in this example is formed by laminating two parallel belt plies, at small angles with respect to the tire circumferential direction, in such directions that the cords of the inner ply 17A cross the cords of the outer ply 17B.

The carcass ply 16a is formed by coating organic fiber cords such as polyester in a sheet-like topping rubber.

The belt plies 17A and 17B are formed by coating steel cords in a sheet-like topping rubber.

Further, on the outside of the belt layer 17, there is disposed a band layer 19 in which organic fiber cords are arranged in substantially parallel with the tire circumferential direction.

Further, the tire T is covered with a tread rubber 12G, sidewall rubber 13G, bead rubber 14G and the like. The tread rubber 12G in this example is disposed outside the band layer 19. The outer surface of the tread portion 12 is provided with a tread pattern formed by circumferentially extending longitudinal grooves G1, lateral grooves G2 crosswise to the longitudinal grooves G1 and the like.

Figure 3:
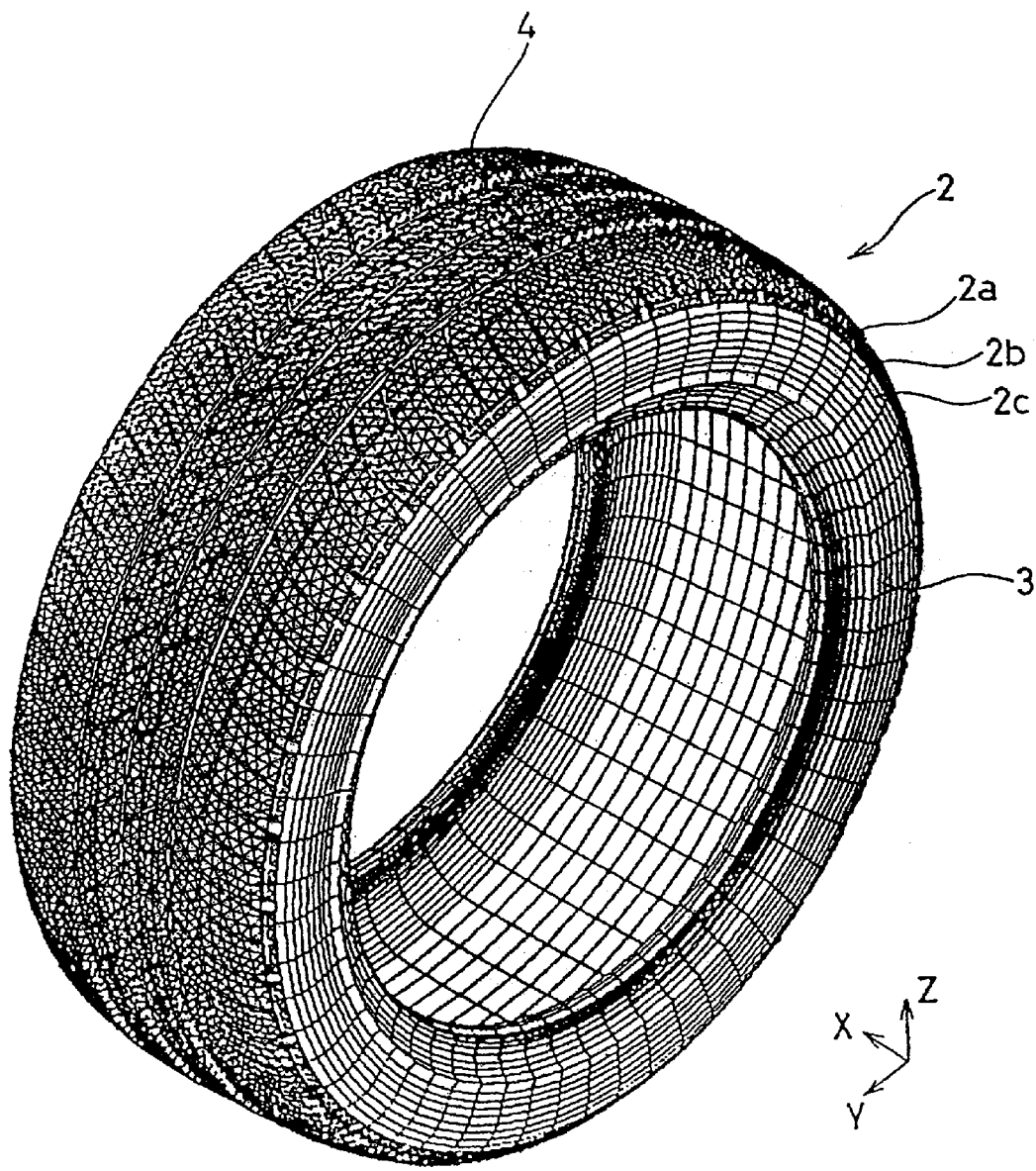
FIG. 3 is a perspective view showing an example of the tire model.

In the tire model 2, as shown in FIG. 3, the tire T, inclusive of plies F—including the carcass ply 16A, belt plies 17A and 17B and band layer 19—is made out of a finite number of elements. Thus, the tire model 2 is an analysis model on which numerical analysis is possible by using a computer.

The elements $2a, 2b$ ... constituting the tire model 2 are elements which can be processed by a computer, to be concrete, two-dimensional elements such as quadrilateral elements, three-dimensional elements such as tetrahedral solid elements, pentahedral solid elements, hexahedral solid elements and the like.

The wording " ... inclusive of the ply ... is made out of a finite number of elements" expresses that the cords of the ply and the topping rubber of the ply are respectively modeled by suitable elements.

Figure 4:
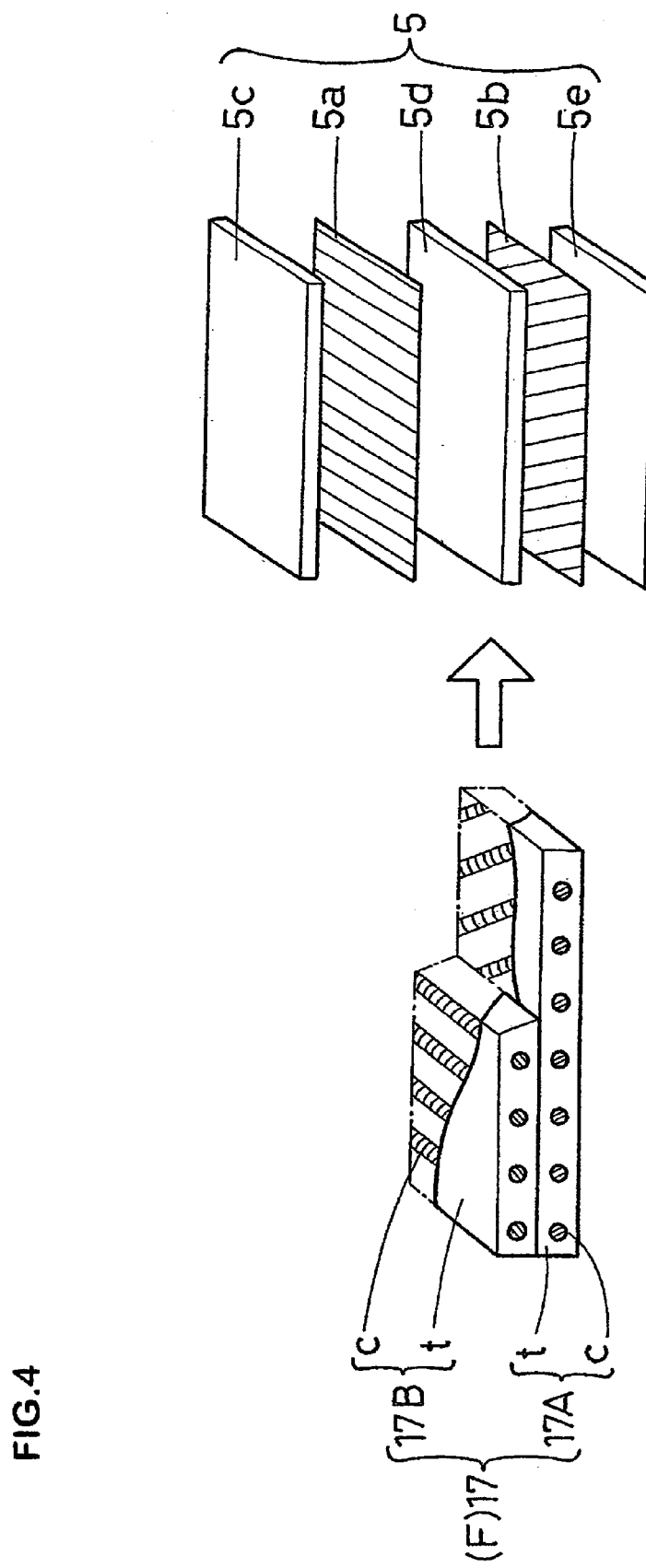

For example, the belt layer 17 is modeled into a belt layer model 5 shown in FIG. 4. That is, the belt cords (c) are modeled by quadrilateral membrane elements $5a$ and $5b$, and the topping rubber (t) coating the belt cords (c) is modeled by hexahedral solid elements $5c, 5d$ and $5e$ covering the quadrilateral membrane elements, and these elements are laminated in order in the thickness direction to form a composite shell element.

As to the material definition for the quadrilateral membrane elements $5a$ and $5b$ for the belt cords (c), the material is set to an orthotropic material having different rigidities between the direction of the belt cords (c) and the direction orthogonal thereto, and the thickness thereof is set to the diameter of the cord (c) for example. It is desirable that the rigidities are treated as being constant in the respective directions.

In the same manner, the carcass ply $16a$ is also modeled.

The hexahedral solid elements $5c, 5d$ and $5e$ representing the topping rubber (t) of the ply F can be treated as being a super visco-elastic material in the same manner as the other rubber members.

As the ply F is modeled in this way according to the properties of the materials of the cords and the topping rubber, it is possible to simulate a state very close to that of an actual product, which is useful for accurate development. When each of the rubber members, plies F and bead core 5 is modeled by the finite elements, the material properties and rigidity are provided according to the complex elastic moduli of the rubber portions and cords, the elastic modulus of the bead core and the like.

In the tire model 2 in this example, the tread pattern comprising the longitudinal grooves G1 and lateral grooves G2 is faithfully modeled by a lot of elements such as tetrahedral element, pentahedral element and hexahedral element alone or in combination. However, if a main object of the development is toward an internal structure such as the rubber material and a profile of the carcass 16, then it is possible to employ a slick tread by omitting the tread pattern from the tire model 2.

In this case, as the total number of the elements in the tire model 2 is decreased, the computing time will be shortened.

As mentioned above, the tire model 2 can be variously modified in aspects as far as it is a finite element model being capable of presenting design factors of the tire to be estimated.

On the other hand, the preparation of the tire model 2 can be made by selecting one from some basic models previously stored in a tire model database (see FIG. 1).

Next, the vehicle body model preparing step s2 will be described.

The vehicle body model preparing step s2 prepares a vehicle body model of the vehicle body to be estimated inclusive of the suspension members thereof which is made out of a finite number of elements. That is, the vehicle body which is the subject of the analysis is defined as an analysis model on which numerical analysis is possible by using a computer.

Figure 5:
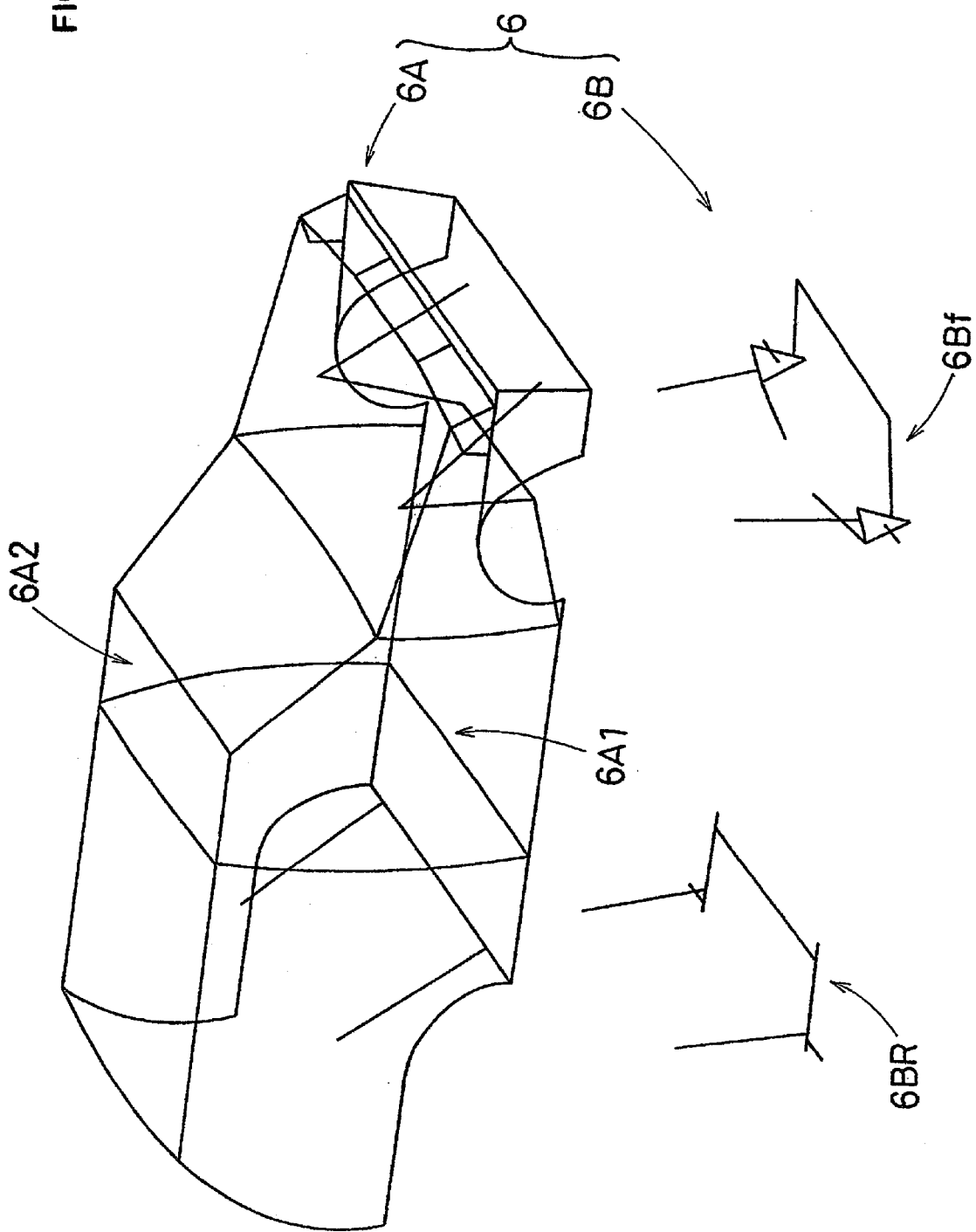
FIG. 5 is a perspective view showing an example of the vehicle body model.
Figure 7A:
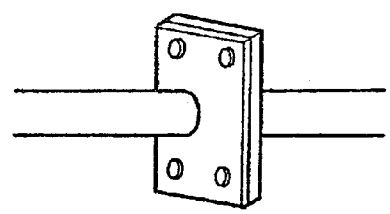
FIG. 7(A) is a schematic view showing a connection of elements.
Figure 7B:
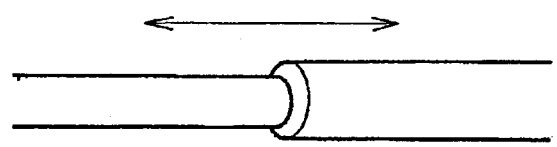
FIG. 7(B) is a schematic view showing a connection of elements.
Figure 7C:
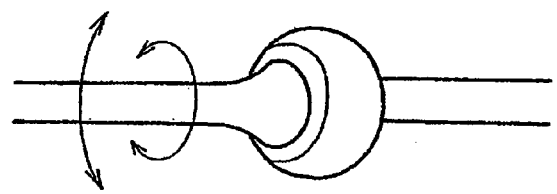
FIG. 7(C) is a schematic view showing a connection of elements.
Figure 7D:
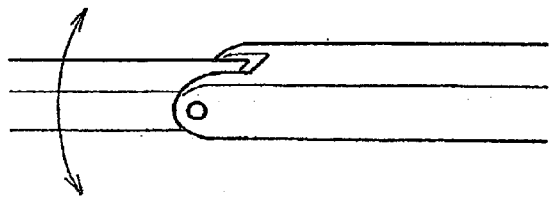
FIG. 7(D) is a schematic view showing a connection of elements.

As shown in FIG. 5, the vehicle body model 6 in this example comprises a vehicle main body model 6A and a suspension model 6B.

The vehicle main body model 6A is of a part of the vehicle from which the wheels and suspension members are excluded, and it is made out of a finite number of elements.

The vehicle main body model 6A in this example includes basic skeleton parts such as a lower frame 6A1 and exterior member 6A2, but parts which substantially do not affect the dynamic performance of the vehicle, such as interior parts and details are omitted from the model.

The vehicle main body model 6A in this example is modeled by rigid elements not deformed by an external force.

However, it may be possible that the vehicle main body model 6A is provided with a deformation property, vibration property and the like which are close to those of the materials used in the actual vehicle body. In this case, a very accurate analysis may be possible.

Further, it is also possible that the vehicle main body model 6A include an engine model (not shown) of the engine made out of a rigid element and supported by a flexible element (for example, a rubber bush) disposed therebetween. In this case, since the engine model moves according to deformation of the supporting flexible element, it becomes possible to estimate the ride comfort and the like of the traveling vehicle more accurately.

The above-mentioned suspension model 6B comprises a suspension model 6Bf for front wheels and a suspension model 6Br for rear wheels. The front wheel suspension model 6Bf is formed as being steerable although its details are not illustrated, whereby the tire model 2 attached to the vehicle main body model 6A can be steered at a predetermined steering angle (a slip angle).

FIG. 6 illustrates the making of a model of a suspension (A) for the rear wheels. The rear wheel suspension (A) exemplarily shown comprises: a pair of trailing arms 26 pivoted to the vehicle body main body in one end portion and provided in the other end portion with a ratable hub 25 to which the tire wheel is attached; a torsion beam 27 connecting a pair of the trailing arms 26 and 26 each other; and a damper beam 32 composed of a shock absorber 30 and a coil spring 31 attached thereto.

Upper and lower portions of the damper beam 32 are respectively attached to the vehicle body main body and the trailing arms by respectively using a damper mount upper bush b1 and a damper mount lower bush b2 therebetween. Further, a trailing arm bush b3 is also provided in the trailing arm fixed to the vehicle body main body.

Therefore, the rear wheel suspension model 6Br of the suspension (A) comprises a hub model 35 of the hub 25, a trailing arm model 36 of the trailing arm, a torsion beam model 37 of the torsion beam, a damper beam model 42 of the damper beam 32 and a bush model 44 of the bushes b1–b3.

As the suspension model 6B is constructed such that mechanical motion thereof can be reproduced, the damper beam model 42 and the bush model 44 are defined as being capable of compressing and expanding in the axial direction thereof by employing a linear or non-linear spring element.

Further, the hub model 35 and the trailing arm model 36 are each defined by a rigid element of which shape is not changed by an external force applied.

The above-mentioned torsion beam model 37 is made of a torsional beam element such that when a torsion is applied thereto, a very small torsional angle is generated and a reaction force corresponding to the torsional angle is generated.

In some cases, the suspension changes its properties when a force is applied thereto and the members are elastically deformed. Therefore, when the hub model 35 and the trailing arm model 36 for example are treated as an element whose deformation can be considered {namely, an element in which magnitude, cross sectional properties (an area, a geometrical moment of inertia and the like) and an elastic modulus are defined}, a simulation accuracy in the steering stability, ride comfort and the like is improved.

With respect to the bush, it is desirable to employ a spring damper model in which a spring constant in the axial direction, a spring constant in the radial direction and a damping property are defined.

Accordingly, it is possible to make a simulation including the deformation of the bush and the estimation of the steering stability, rid comfort and the like can be improved.

The elements constituting the suspension model 6B and their connections (nodes) are modeled according to their dynamic conditions as shown in FIG. 7. That is, a rigid connection treated as being fixed to each other where any motion is not permitted (FIG. 7(A)), a slide connection where motion in the axial direction is permitted (FIG. 7(B)), a joint connection where rotary motion and swing motion about multi axes are permitted (FIG. 7(C)), a rotational joint connection where swing motion about one axis is permitted (FIG. 7(D)) or the like is selected.

Further, the link rod, stabilizer and the like are modeled by using suitable elements as occasion demands, although the detailed illustration is not presented.

In the vehicle body model 6, the weight, moment of inertia and coordinates of the position of the center of gravity thereof are defined.

In the suspension model 6B, coordinates of the positions for mounting to the vehicle main body model 6A, spring constants and damping factors of the respective spring elements, bending rigidities, torsional rigidities, link weights, coordinates of the position of the center of gravity, moment of inertia and the like of the respective beam elements, are defined.

In order to make a more detailed consideration of deformation and stress in various portions of the vehicle body, it is possible to make a model by using finite elements such as beam, shell, solid and the like in the whole of the vehicle body or a part thereof to be considered. In these elements, the deformation (strain) and the stress can be computed on the basis of the elastic modulus and the shape thereof. For example, in the case of the beam element in which the length, cross sectional properties (the area, geometrical moment of inertia and the like) and elastic modulus are defined, tensile deformation, bending deformation and stress can be computed.

In this example, the tire model preparing step S1 is executed before the vehicle body model preparing step s2. However, the vehicle body model preparing step may be executed before the tire model preparing step. Further, they can be executed in parallel.

Next, the vehicle model preparing step is described.

Figure 8:
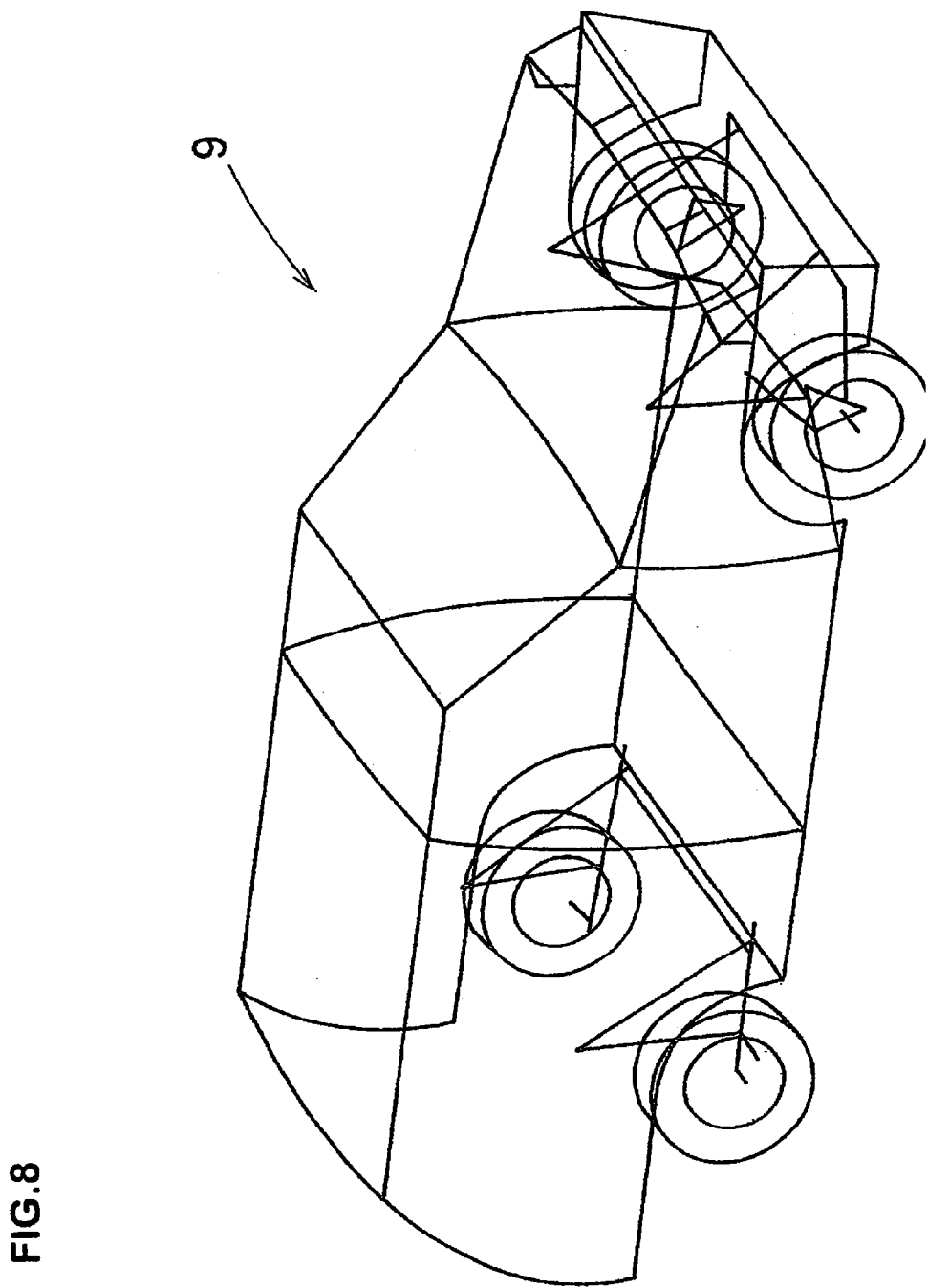
FIG. 8 is a perspective view showing an example of the vehicle model.

The vehicle model preparing step s3 prepares a vehicle model by attaching the tire model 2 to the suspension model 6B of the vehicle body model 6. The tire model 2 is attached to the suspension model 6B by a rim model (not shown) of the wheel rim made out of a rigid element for example. Thus, as shown in FIG. 8, the vehicle model 9 is made.

It is well known that the traveling performance of a vehicle is largely affected by the ground contact shape, ground contact pressure distribution and the like of the tire. Accordingly, a precondition for accurate estimation of the vehicle/tire performances is that the ground contact shape, ground contact pressure distribution, deflection shape and the like of the tire model 2 can be obtained with accuracy.

Figure 9:
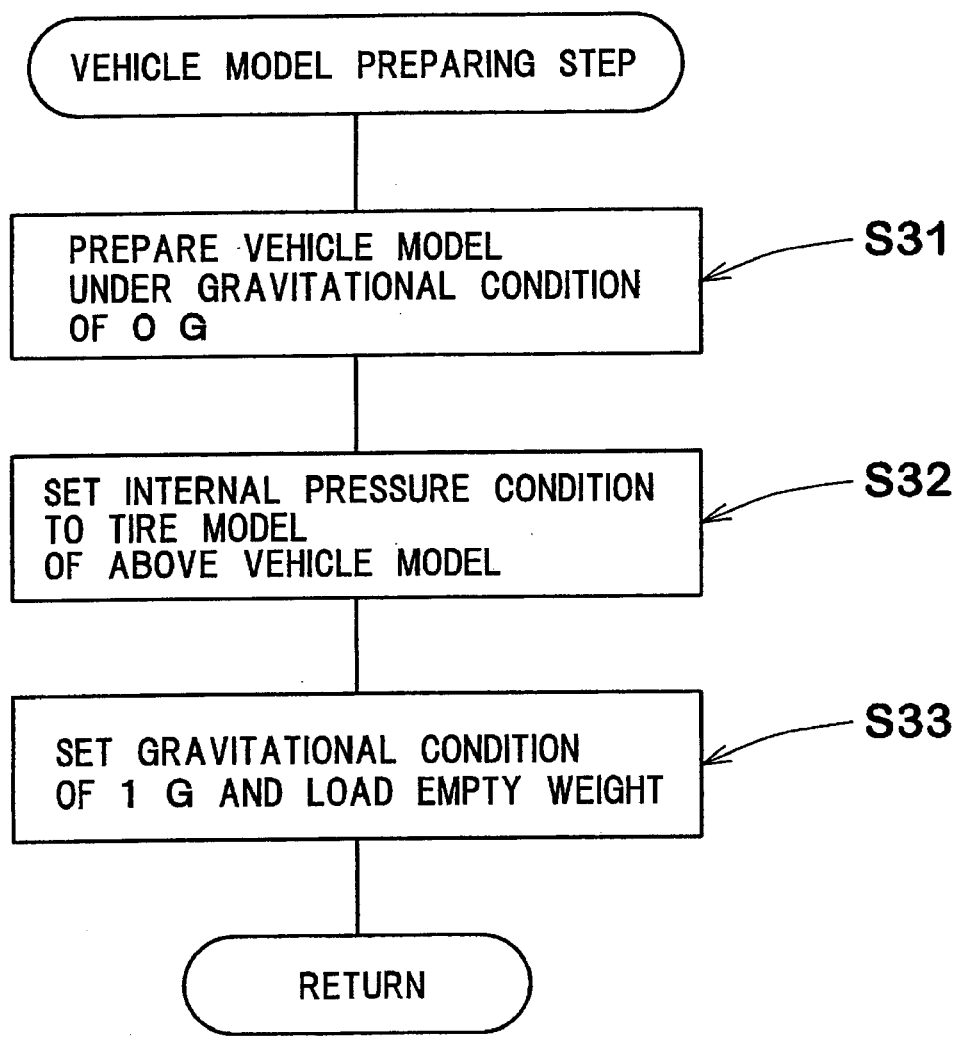
FIG. 9 is a flow chart showing an example of the vehicle model preparing step.

In this embodiment, therefore, as shown in FIG. 9, the vehicle model preparing step s3 comprises a step s31 of preparing the vehicle model 9a under a gravity condition of 0 G (G shows a standard gravitational acceleration or 9.80665 m/s2), a step s32 of setting an internal pressure condition to the tire model 2, and a step s33 of applying a load of the vehicle body model 6 to the tire model 2 by setting the gravitational condition to substantially 1 G after setting the internal pressure condition to the tire model 2.

Setting the internal pressure condition to the tire model 2 means to execute an expansive deformation simulation by setting the internal pressure condition to the tire model 2. For example, it can be executed by applying a uniformly distributed load corresponding to the internal pressure to an inner cavity surface of the tire model 2 after the bead portions of the tire model 2 are forcibly deformed into a width equal to the rim width and fixed so as to simulate a state mounted on the wheel rim.

Then, based on the uniformly distributed load, the expansive deformation of the tire model 2 is computed to execute the simulation.

By setting the internal pressure condition to the tire model 2 under a weightless condition in which the weight of the vehicle body model 6 is not yet applied thereto, the state of a uniform and natural expansive deformation close to the actual tire can be simulated on the tire model 2. Therefore, it is possible to accurately reproduce (simulate) the shape, the internal tension and the like of the tire when the internal pressure is applied thereto.

By making the vehicle model 9 under the gravitational state of 1 G after the internal pressure condition is set to the tire model 2, the weight of the vehicle body model 6 is applied to the tire model 2 through the suspension model 6B. The tire model 2, to which the internal pressure condition has been already set, deflects and deforms according to a relation between the weight of the vehicle body model 6 and the internal pressure, and an initial state of 1 G is so set thereto. Thereby, the ground contact shape, ground contact pressure distribution, deflection shape and the like of the tire model 2 can be obtained with accuracy. Further, the vehicle body model 6 is accordingly set in the initial state of 1 G. (see FIG. 10(A)).

It may be considered to combine the tire model 2 and vehicle body model 6 to which the gravitational condition of 1 G is already separately set. In this method, however, there is a case in which forces of the tire model 2 and vehicle body model 6 can not be accurately balanced at the time of combining them and a vibration is generated in the vehicle model 9. Further, it is not guaranteed that a tire deflection load, a suspension deformation load and the vehicle weight are balanced at the initial stage of the combination because each of the gravitational states of 1 G is obtained by a load set, not a true load. (If the front right wheel load is 550 kgf at the time of being set for example, there is a case where it becomes actually 555 kgf due to an inclination of the vehicle body caused by tire deformation and suspension deformation.) In this case, as the vibration is generated in the vehicle model 9 due to the unbalance at the initial stage of the combination, it is necessary to execute a simulation for estimation after the load is balanced by damping the vibration.

On the other hand, in the case that the load is first applied to the tire model and thereafter the internal pressure is set to the tire model 2, as the load is applied to the tire whose internal pressure is zero and the tire model 2 is largely deformed, it is necessary to compute taking a bending deformation of the tire sidewall portion into consideration. Accordingly, this is not preferable. Further, an element being capable of representing a large bending deformation of the sidewall portion is required. This is thus not practical.

Figure 10A:
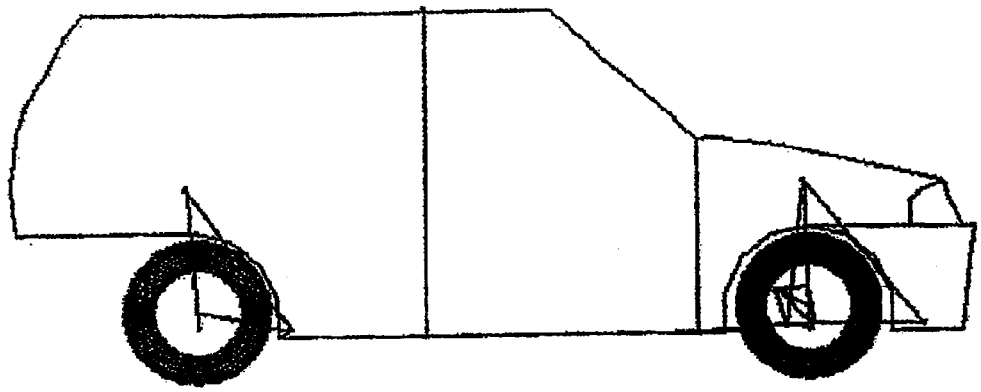
FIG. 10(A) is a side elevational view visualizing the vehicle model under the gravitational condition of 1 G.
Figure 10B:
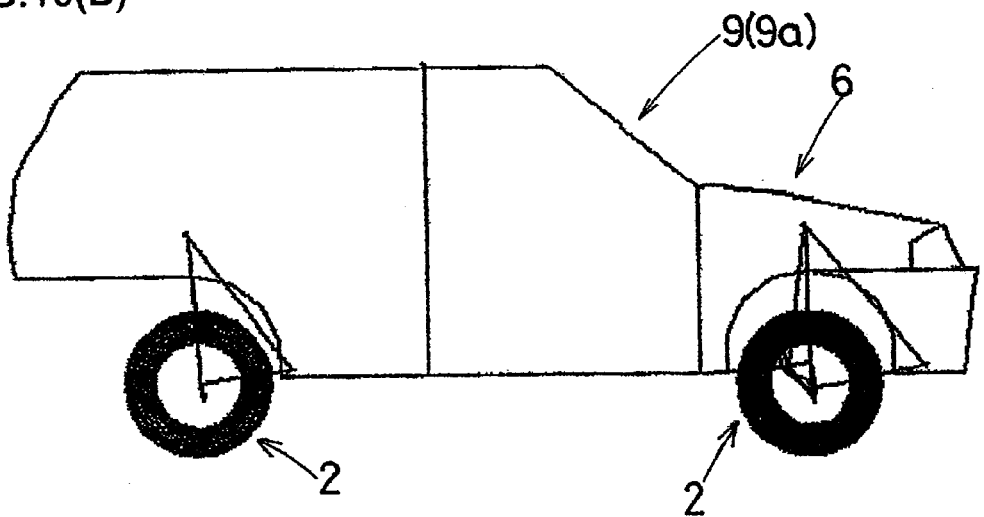
FIG. 10(B) is a side elevational view visualizing the vehicle model under the gravitational condition of 0 G.

The method of preparing the vehicle model 9 is not specially limited. Accordingly, it is possible to employ a method in which the vehicle model 9 of 0 G is made from the beginning, at the initial stage of the preparation, and a method in which the vehicle model 9 under the gravitational condition of 0 G is made in a pseudo manner by first preparing the vehicle model 9 under the gravitational condition of 1 G as shown in FIG. 10(A), and removing a load corresponding to the gravity of 1 G therefrom as shown in FIG. 10(B).

In the latter case, therefor, there is made such a simulation that an initial stress in each part under the gravitational condition of 1 G is computed, and then, from the vehicle model 9 under the gravitational condition of 1 G, a load is removed so that the initial stress becomes zero. Accordingly, as is apparent from the comparison between FIGS. 10(A) and 10(B), for example, the suspension model 6B can extend in a range that its mechanical restriction allows, and the suspension geometry of 0 G (a weightless state) can be set.

Under the gravitational state of 1 G, as to the suspension for example, the weight of the vehicle body model 6A based on 1 G is applied thereto, and the coil spring 31, bushes and the like already have a stress and strain at the initial stage.

In this embodiment, by executing the above-mentioned steps s31 and s32, it is possible to reproduce the vehicle model 9 having the stress and strain of the suspension generated at the initial stage under 1 G.

In the numerical analysis employing the finite element method, the computation is executed based on the stress and strain generated in each part when the loads are applied to the vehicle body model 6 and tire model 2.

Accordingly, in the vehicle body model 6 based on the 1 G state, the strain and stress generated in the suspension according to the gravity of 1 G are ignored in the computation, and there is a possibility that the simulation accuracy is lowered.

In this embodiment, computing error particularly in the suspension model 6B is avoided without making the modeling operation so complex, and it is possible to obtain more accurate simulation results on the vehicle/tire performances.

It is possible to depend the load applied state of the suspension model on only the displacement of the damper beam model 42 for example. Further, it is possible to depend the load applied state also on the deformation of the bush or the like. In the latter case, it is possible to compute the suspension geometry under the 0 G state by applying a load to the center of an axle of the vehicle model under the 1 G state towards a direction to remove the load on each wheel.

With respect to the vehicle model in the geometry under the gravitational condition of 0 G computed in the manner mentioned above, the weight thereof is applied thereto assuming the internal stress is zero.

Figure 11:
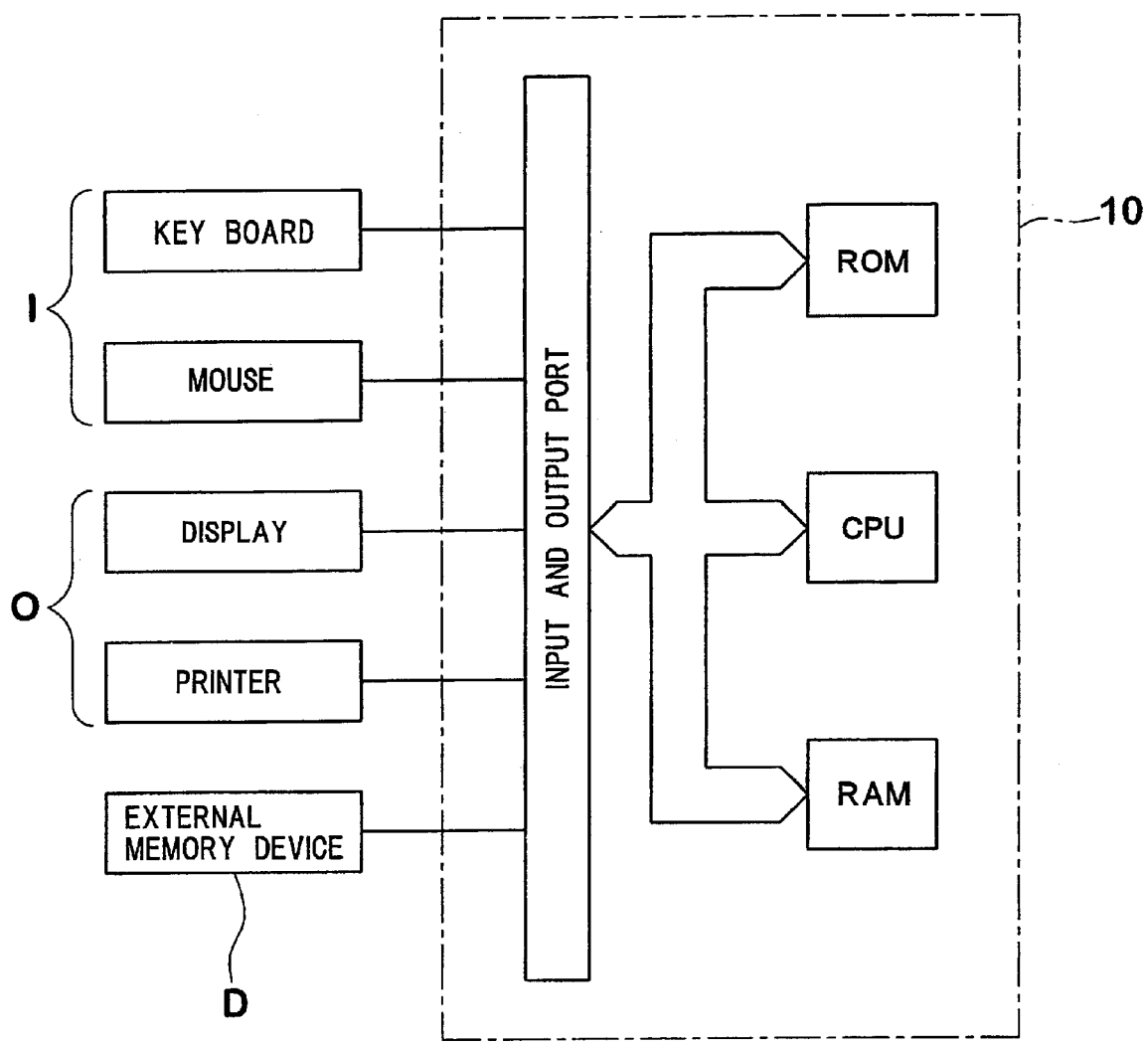
FIG. 11 is a schematic view of a computer executing the present invention.

As an apparatus for executing the simulating method, a computer 10 shown in FIG. 11 for example is used.

The computer 10 comprises a CPU corresponding to an arithmetic processing unit, a ROM in which a processing procedure of the CPU and the like are previously stored, a RAM corresponding to a processing memory of the CPU, an input and output port and a data bus connecting them. In this embodiment, the above-mentioned input and output port is connected with inputting means I for inputting and setting information such as a key board, mouse and the like, outputting means O capable of displaying input result and simulation result such as a display, printer and the like, and an external memory unit D such as a magnetic disc unit, magnetic optical disc unit and the like. The external memory device D can memorize processing procedure for simulation, other programs and data.

In this embodiment, a traveling simulation of the vehicle model 9 is executed by using the computer 10 based on a boundary condition. And it is possible to obtain information on approximate traveling property of the vehicle and tire performances to be analyzed (steps s5 and s6).

A general simulating method in which a tire model 2 is used has been provided. (For example, Laid-open Japanese Patent Application No. 11-153520 and the like). In this simulating method, although the performance of a tire alone can be estimated, fitness or suitability between the tire performance and the vehicle properties such as the vehicle body rigidity, suspension property and the like can not be sufficiently estimated. In the present invention, therefore, both of the vehicle body and tire are modeled by using the finite element method and the models are combined so as to make the vehicle model, and then the traveling simulation is executed on the computer, whereby it is possible to develop and estimate the tire so as to fit the vehicle in every detailed aspect.

As to the vehicle body model, it helps to make development of the vehicle body rigidity, suspension members and the like while making good use of the tire properties.

In the traveling simulation in this embodiment, the vehicle model 9 is run on the road model 11 under the predetermined boundary condition. The wheel rim size, internal pressure, speed, steering angle and the like may be listed as the boundary condition to be inputted in relation to the tire model 2. The speed can be given by moving the vehicle body model 6 or rotating the drive wheels.

The steering angle can be reproduced by rotating the tire model 2 around a king pin (not shown) at a predetermined angle.

Figure 12A:
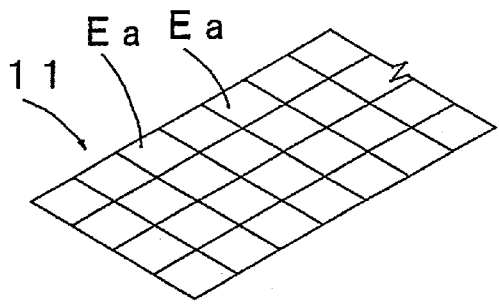
FIG. 12(A) is a perspective view showing an example of the road model.
Figure 12B:
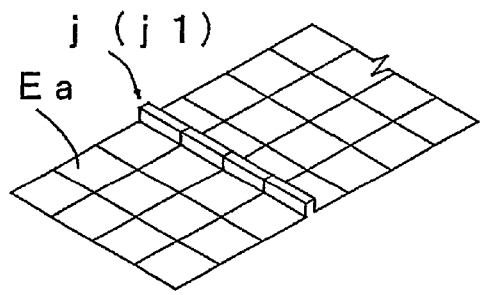
FIG. 12(B) is a perspective view showing an example of the road model.
Figure 12C:
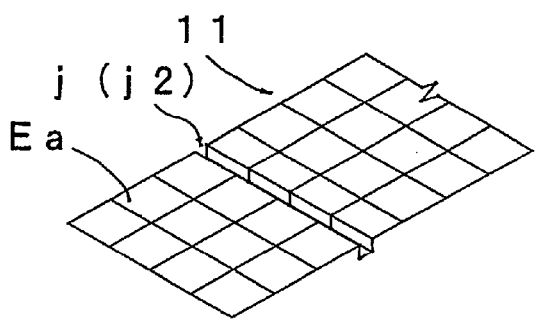
FIG. 12(C) is a perspective view showing an example of the road model.
Figure 12D:
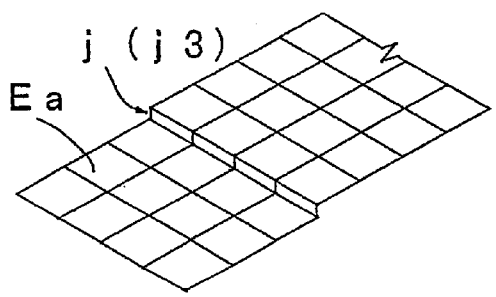
FIG. 12(D) is a perspective view showing an example of the road model.
Figure 12E:
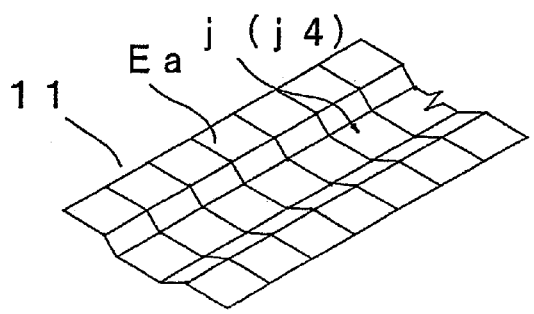
FIG. 12(E) is a perspective view showing an example of the road model.

As to the road model 11 on which the vehicle model 6 is virtually run, for example, a flat road model made out of a rigid element Ea having a rectangular rigid surface as shown in FIG. 12A, and a road model including uneven part (j) as shown in FIGS. 12B to 12E can be defined. The uneven part (j) includes a protruding portion j1, a recess portion j2 and/or a step j3 (FIGS. 12(B) and 12(C)) extending at a right angle to the moving direction x of the vehicle model 9, and further the uneven part (j) may be variously defined such as a rut-shaped recess portion j4 extending along the moving direction of the vehicle model 9 (FIG. 12D), a combination of the above (not shown) and the like. Further, the uneven part (j) can be, for example, defined by connecting rigid elements Ea so as to correspond to the shape of the road surface.

When the steering stability or the like is estimated as one of the vehicle's traveling properties, it is preferable that the road model 11 is a flat one made out as a flat surface which is geometrically infinite or finite. When the ride comfort, rut ride-over property, projection ride-over property or the like is to be estimated, it is preferable that the road model 11 includes the uneven part j.

In the tire model 2 and road model 11, a possibility of contact therebetween is defined. In a simulation in time sequence, it is always judged whether or not both elements are in contact with each other. Between the surface of the tire model 2 and the road model 11, a coefficient of friction is defined. When they are in contact, a frictional force to be generated by the friction coefficient is computed and applied to the tire model 2. Thus, by adjusting the friction coefficient, it can be easily set to an icy road surface, e.g. frozen road.

Further, when making an estimation of wet traveling performance (or hydroplaning performance) during running on a road surface having a puddle by the vehicle, on-the-snow traveling performance during running on a snowy road surface by the vehicle, muddy terrain traveling performance during running on a muddy terrain by the vehicle or sandy terrain traveling performance during running on a sandy terrain by the vehicle, it is necessary to take it into consideration that the water, snow, mud, sand or the like being in contact with the tire flows or is deformed, which affects the traveling performance.

When simulating such vehicle's traveling, the water, snow, mud or sand is modeled by an element being capable of expressing a force applied thereto and fluidization or deformation, and the model is provided on the rigid element Ea.

In case of a wet traveling performance estimation, a water element is provided on the rigid element Ea. In case of an on-the-snow traveling performance estimation, a snow element is provided on the rigid element Ea. In case of a muddy terrain traveling property estimation, a mud element is provided on the rigid element Ea. In case of a sandy terrain traveling performance estimation, a sand element is provided on the rigid element Ea.

When modeling a subject material of high flowability such as water, a grid is set on a space over the rigid element Ea in a three-dimensional manner, and then an Euler's element for calculating the density, speed and pressure applied to the subject material is defined at each of the grid points, whereby the water element can be defined.

On the other hand, when modeling a highly deformable subject material such as snow and mud, it is divided into finite elements, and a Lagrange's element is employed to calculate a density change, deformation and stress applied to each element. Thus, the snow element and mud element can be defined by a Lagrange's element.

If it is rather difficult to say which of the flowability and deformability is higher such as the sands, then it is desirable to use or define a mixture of the Euler's element and Lagrange's element as a sand element.

Figure 13C:
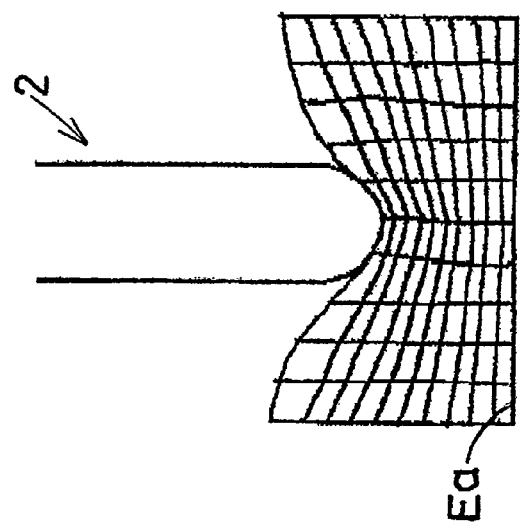
FIG. 13(A) is a chart describing an Euler's element.
FIG. 13(B) is a chart describing a Lagrange's element.
Figure 13B:
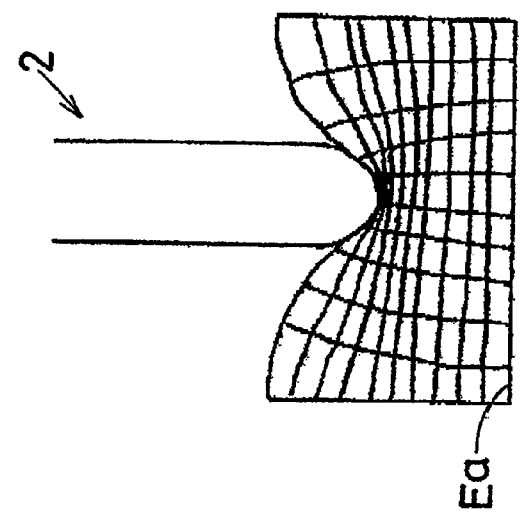
Figure 13A:
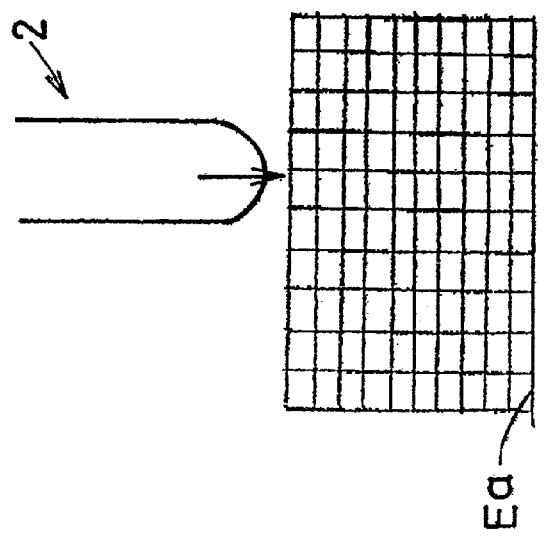

In this case, at first, as shown in FIGS. 13(A) and 13(B), the calculation is first executed on the basis of the Lagrange's element on the assumption that the sand is deformed. Thereafter, as shown in FIG. 13(C), an operation for returning the deformed element back to the original shape (re-mesh) is executed, and then the calculation on the Euler's element is to executed.

Next, the traveling simulation of the vehicle model 9 is executed by time integrating the following equation of motion.

$$m\ddot{x} + c\dot{x} + hx = F$$

wherein m is a mass, c is a damping coefficient, h is a rigidity and F is an external force. with respect to each of the elements of the rigid body, spring and tire constituting the present simulation, the above-mentioned formula is prepared, and they are integrated at very short time steps to simulate the state of the vehicle model 9 hour by hour. The time steps used in this case must be smaller than a minimum time among the times for which a stress wave transmits through the individual finite elements used. Accordingly, the steps are preferably set to form about $10^{-5}$ to $10^{-6}$ sec although the steps depend on the size of the element.

Further, in a part where a contact phenomenon occurs such as a part between the road model and tire model 2, it is defined by considering the contact. That is, when the contact between the road model 11 and tire model 2 is detected within a very short time step mentioned above, a reaction force is applied to a portion of the tire model 2, which portion will inroad into the road model if assumed that no contact exists, and which reaction force is capable of pushing back this portion, whereby it is possible to simulate the contact.

On the contrary, when elements other than the rigid element such as the water element or the like exist in the road model 11, the boundary surface is set at the surface of the tire model, and the elements existing in the portion corresponding to the boundary surface are removed (coupling with fluid).

In accordance with the simulation executed in the process mentioned above, a deformed shape, speed, acceleration, force (pressure) and the like in each part are computed and output. Practically, the above-mentioned computation can be executed by using an application soft "LS-DYNA" created by LIVERMORE SOFTWARE TECHNOLOGY CO., LTD. (LSTC) in U.S.A.

In this simulation step in this embodiment, the vehicle model having an initial speed v (not=0) is used.

When computing a traveling state in accordance with the vehicle/tire traveling simulation, we may consider that the speed is increased from zero to an estimating speed. This method, however, increases the time required for the acceleration and the distance for which the vehicle model moves during that time. And the size of the model increases and the computing time becomes very long.

Further, we may consider that a great acceleration is applied to the vehicle model 9 to decrease the computing time. In this method, however, there is a case where due to the application of the great acceleration the element of the vehicle model 9 is crushed and the calculation becomes impossible.

In this embodiment, therefore, in order to solve the problems mentioned above, an initial speed v (not=0) is set to the whole of the vehicle model 9.

To the vehicle main body model 6A and the suspension model 6B, a parallel speed component that is a component of the speed in parallel with the travelling direction of the vehicle, is applied. If assumed that a longitudinal direction of the vehicle is x, a widthwise direction is Y and a vertical direction is Z, then the initial speed is applied to along the x direction.

To the tire model 2 (including the rim model), a total speed of the parallel speed component and a rotational component is defined and applied thereto.

It is desirable that the initial speed is the same as the estimating speed. When a plurality of speed stages for estimating exist, it is possible to execute a series of same operations in every stage, or to change the speed.

As to the influence of the acceleration from zero speed to the initial speed, for example, there is a case where luggage or the like in the vehicle model 9 is moved by the acceleration and the position of the center of gravity of the vehicle model 9 is changed. Such a case is however, very rare, and the acceleration has substantially no influence on the traveling simulation.

By previously setting the initial speed v to the vehicle model 9 in the manner mentioned above, the tire/vehicle traveling simulation immediately becomes a traveling state at the initial speed without executing the calculation for during acceleration, whereby it is possible to greatly shorten the computing time.

Figure 14:
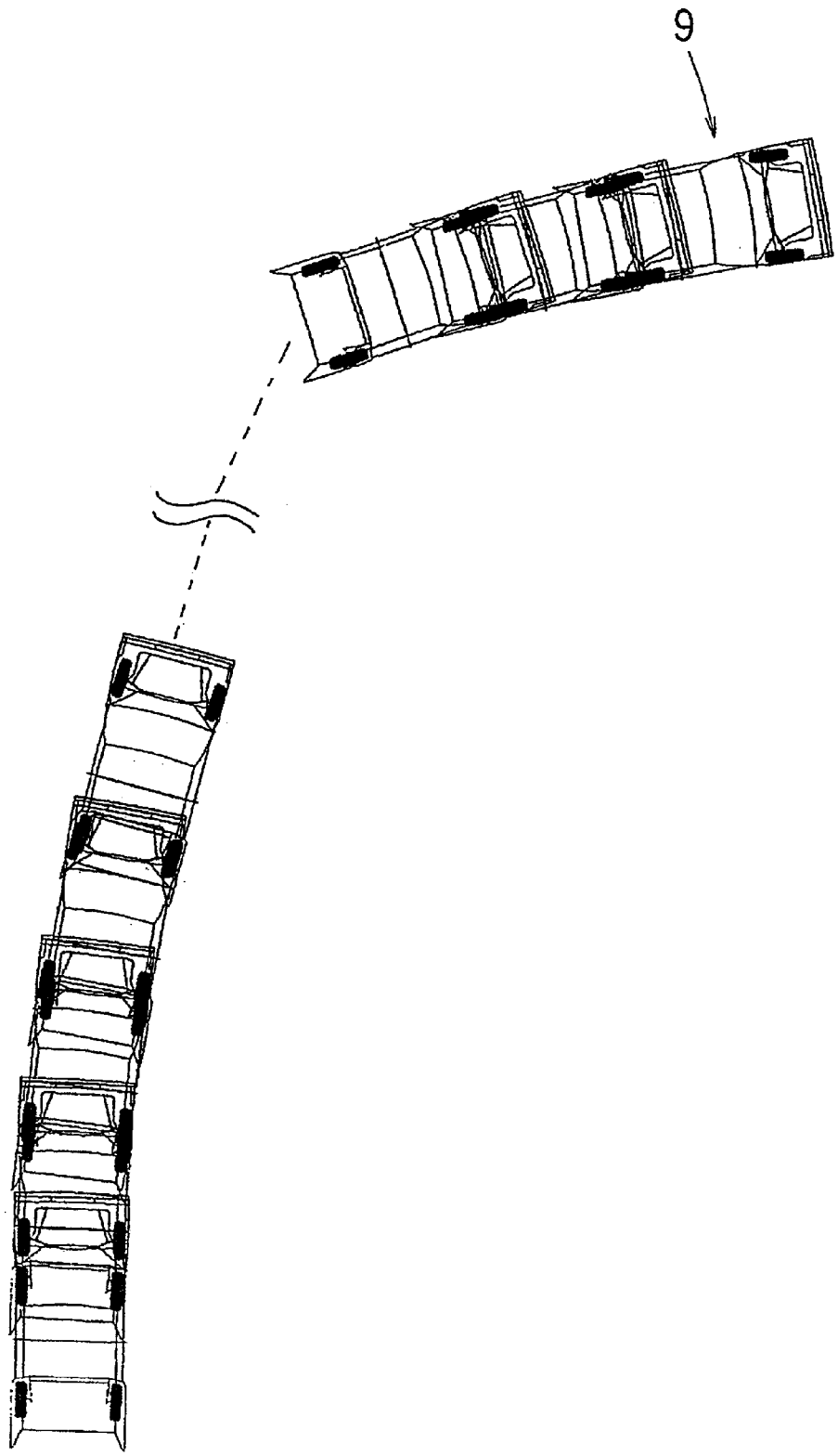
FIG. 14 is a chart showing a trajectory of the traveling vehicle model.
Figure 15:
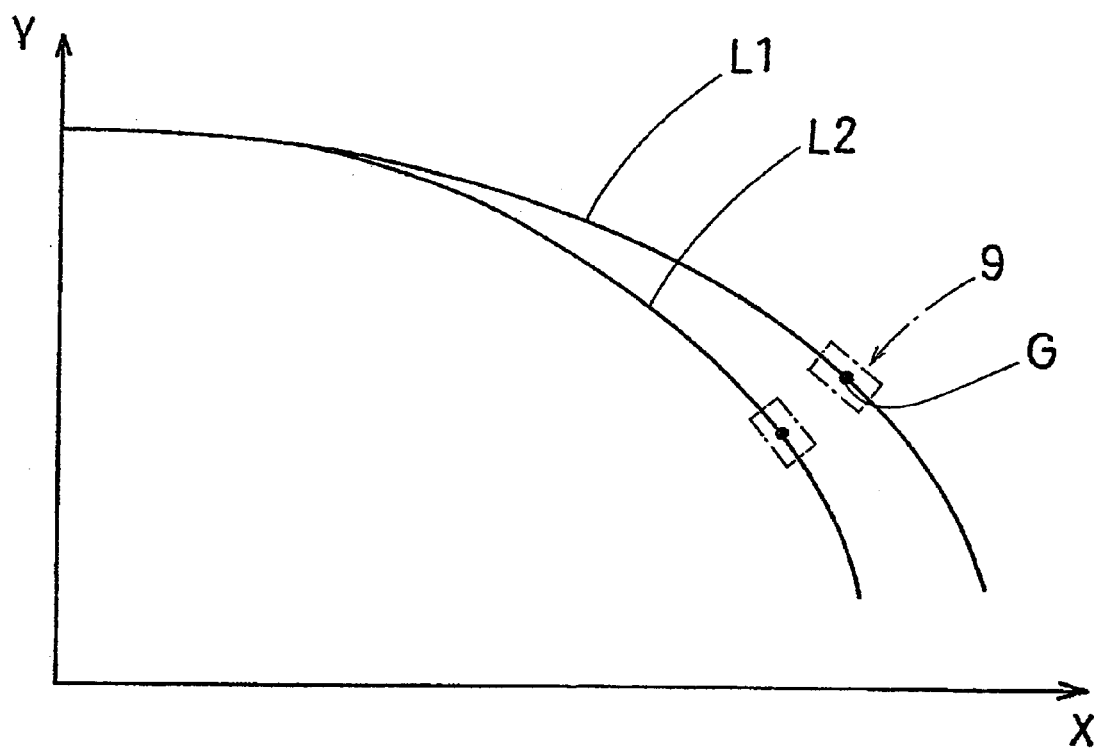
FIG. 15 is a schematic diagram for FIG. 14.

FIG. 14 shows a traveling locus of the vehicle model 9 obtained by executing the vehicle traveling simulation mentioned above, and FIG. 15 shows locus curves L1 and L2 of the position G of the center of gravity of the vehicle model 9.

In case of the locus curve L1, the vehicle model tends to protrude outwards during turning, that is, a so-called understeer tendency is increased, namely, it is not a targeted neutral steer. If it is judged from the simulation result that the target is not achieved ("N" in step s7), then design factors of the tire are changed as in step s11 and again the simulation is executed (step s5). For example, as the design factors of the tire, changing the definition of the tread rubber element of the front wheel tire model 2 into an element having a high gripping force, improving the tread pattern, improving the internal structure of the tire and the like may be listed. Then, by executing the traveling simulation again, as shown in FIG. 11 by the locus curve L2 for example, if the position of the center of gravity of the vehicle model 9 is improved, it is expected that the targeted neutral steer is almost achieved.

As another example of the vehicle's traveling properties, there is a vehicle body vibration property under 10 Hz. This property is a performance relating to a relatively large motion in a frequency range of under 10 HZ of the vehicle during traveling. Such a long-cycle motion mainly comes from the suspension property and the tire performance, and is hardly affected by small deformation or the like of the vehicle body main body and chassis. This was found out.

When such property is estimated, it is accordingly desirable that the vehicle main body model 6A is made (defined) by the rigid body model which is not deformed by an external force applied thereto. In the rigid model, a minimal number of variables by which the calculation of the motion is possible, for example the mass, coordinates of the center of gravity, moment of inertia and the like are defined. By defining the vehicle main body model 6A as described above, the traveling simulation does not require the calculation for the deformation of the vehicle main body model, and the computing time can be greatly decreased.

As another example of the vehicle's traveling properties, there is a vehicle body vibration property over 10 Hz but under 100 Hz. This vibration property is a performance relating to a small vibration of the vehicle during traveling whose frequency is more than 10 Hz but not more than 100 Hz, and it is mainly and largely affected by a combination of the vibration mode of the vehicle body and the tire property. When simulating such property, it is desirable that the vehicle body model 9 has a vibration mode substantially same as that of the vehicle body to be estimated.

Figure 16:
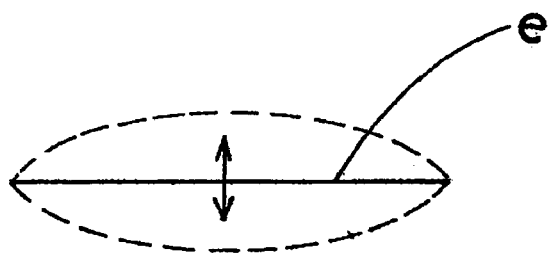
FIG. 16 is a schematic diagram showing a vibration of one rod.
Figure 17:
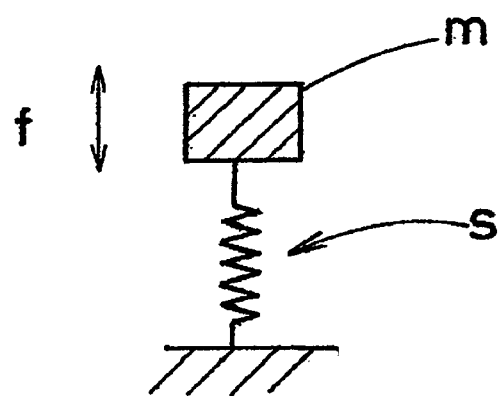
FIG. 17 is a diagram showing a model of a mass and spring system of FIG. 16.

As descried above, the vehicle body model 6 is defined as a vibration model which has the vibration mode of the vehicle body of the vehicle to be estimated. Incidentally, the vibration mode is a vibration mode inherent to the system which has a discrete frequency spectrum in which a characteristic motion style exists at each frequency. The vibration mode of the vehicle body of the vehicle to be estimated can be obtained by a vibrating experiment or a modal analysis of the finite element model. In a simple example shown in FIG. 16 where a bar has a primary vibration mode at f Hz, the vibration thereof can be defined by a vibration model which is a combination of a mass m and a spring s and has a single-degree-freedom as shown in FIG. 17, and the frequency f can be expressed by a specific function. In the same manner as in this example, by changing the vehicle body model 6 into a vibration model corresponding to the vibration mode of the vehicle body, it is possible to simplify the handling in the simulation.

As to the damping, the damping property obtained by the vibrating experiment on the actual car is defined.

In this example, the vibration property is included in the vehicle body model, and the calculation including considerations of the vibration deformation of the vehicle body is possible although the computing time becomes longer in comparison with the rigid model, and it is possible to simulate the vibration of the vehicle body at the above-mentioned frequency more accurately.

Figure 18:
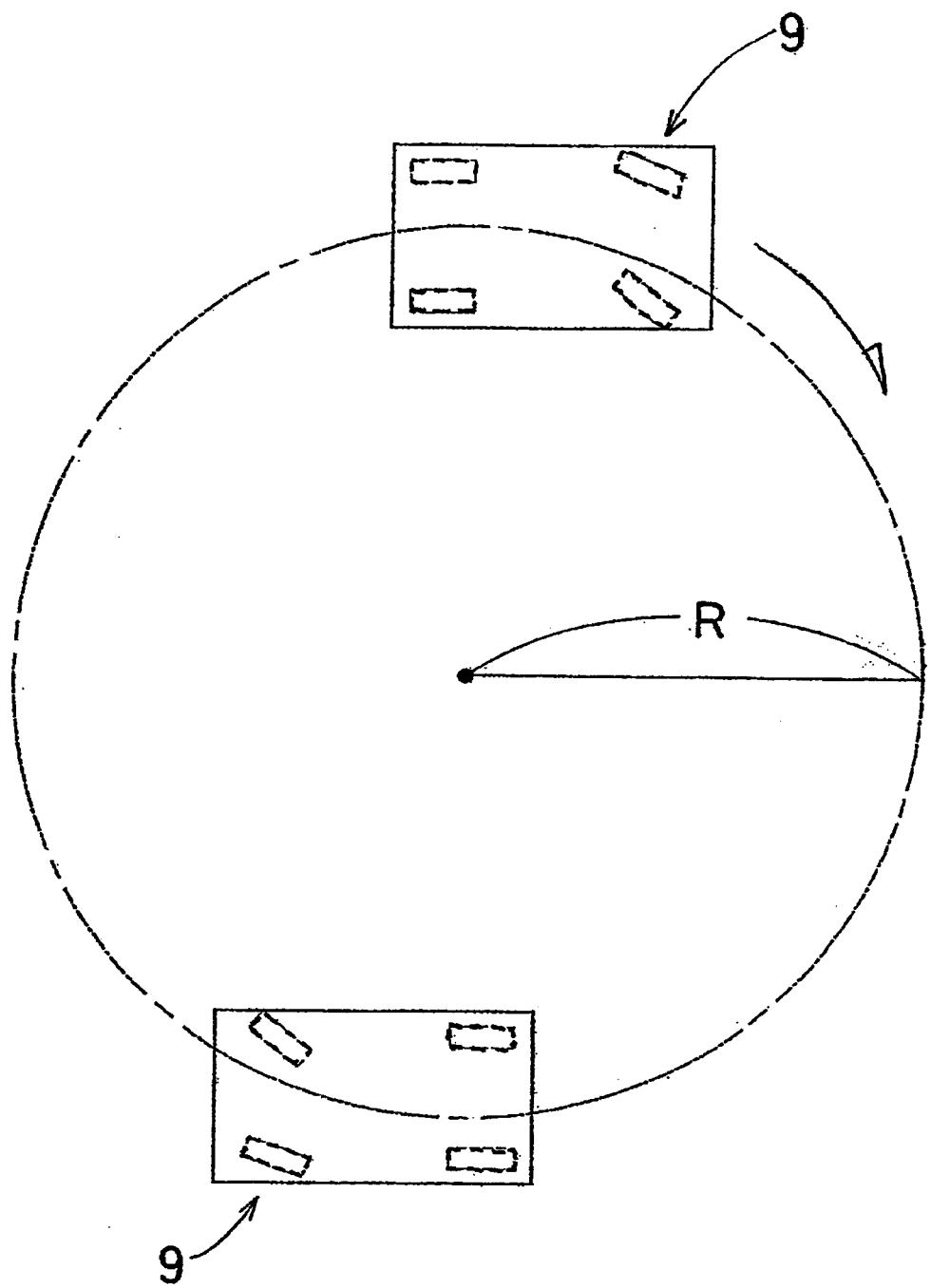
FIG. 18 is a conceptual diagram for explaining the steady circling simulation.
Figure 19:
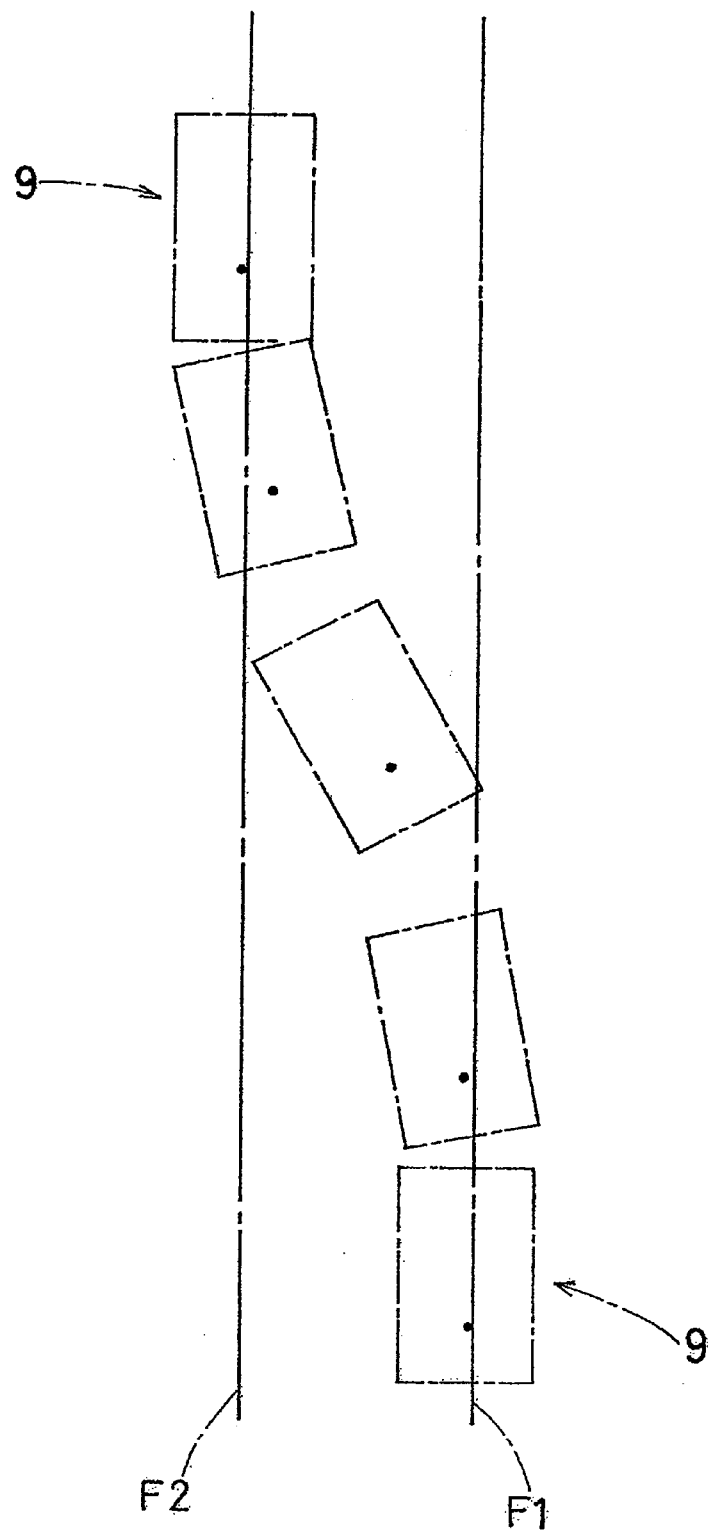
FIG. 19 is a conceptual diagram for explaining the lane change simulation.

Further, as another example of the vehicle's traveling properties, a steering property can be included. As shown in FIG. 18 for example, the steering property can be estimated by a turning radius R of the vehicle model 9 or a roll angle of the vehicle model 9 which are obtained in a steady circling simulation. The steady circling simulation is executed by running the vehicle model 9 on the road model 11 at a constant speed, with the steering angle of the tire model 2 fixed.

From the simulation, it is possible to obtain the information relating to the locus (circle) which the point of center of gravity of the vehicle model 9 draws and to find the turning radius R of the vehicle model 9.

With respect to the steering property, an understeer tendency or an oversteer tendency may be foreseen by the turning radius R. By preparing various tire models 2 and finding the turning radii thereof at the same speed in the steady circling simulation, a comparison on the tire performance can be easily made.

Thus, for the purpose of greatly shortening the developing time of the tire model 2 and suspension model 6B, it is useful to forecast the steering property before trial manufacture.

Aside from the above-mentioned turning radius, the steering property can be estimated by a roll angle of the vehicle model 9 during the turning. Here, the roll angle is an inclination angle of the vehicle model toward the outside of the turn.

Further, as still another example of the vehicle's traveling properties, a lane change property can be included. The lane change is, as shown in FIG. 18, an operation to laterally move the traveling vehicle model 9 from a lane F1 to a lane F2 by giving a steering angle thereto and then returning to the previous steering angle. In the above-mentioned traveling simulation step, a lane change simulation for simulating the lane change is executed by using the vehicle model 9 and the road model 11. In the lane change simulation, information relating to the behavior of the vehicle model 9 (e.g. a change of the roll angle, a change of a lateral acceleration and the like) or the convergent property (oscillation of the locus of the point of center of gravity of the vehicle model and the like) at the time of returning the steering angle of the vehicle model is took out to estimate the performance thereof.

Figure 20:
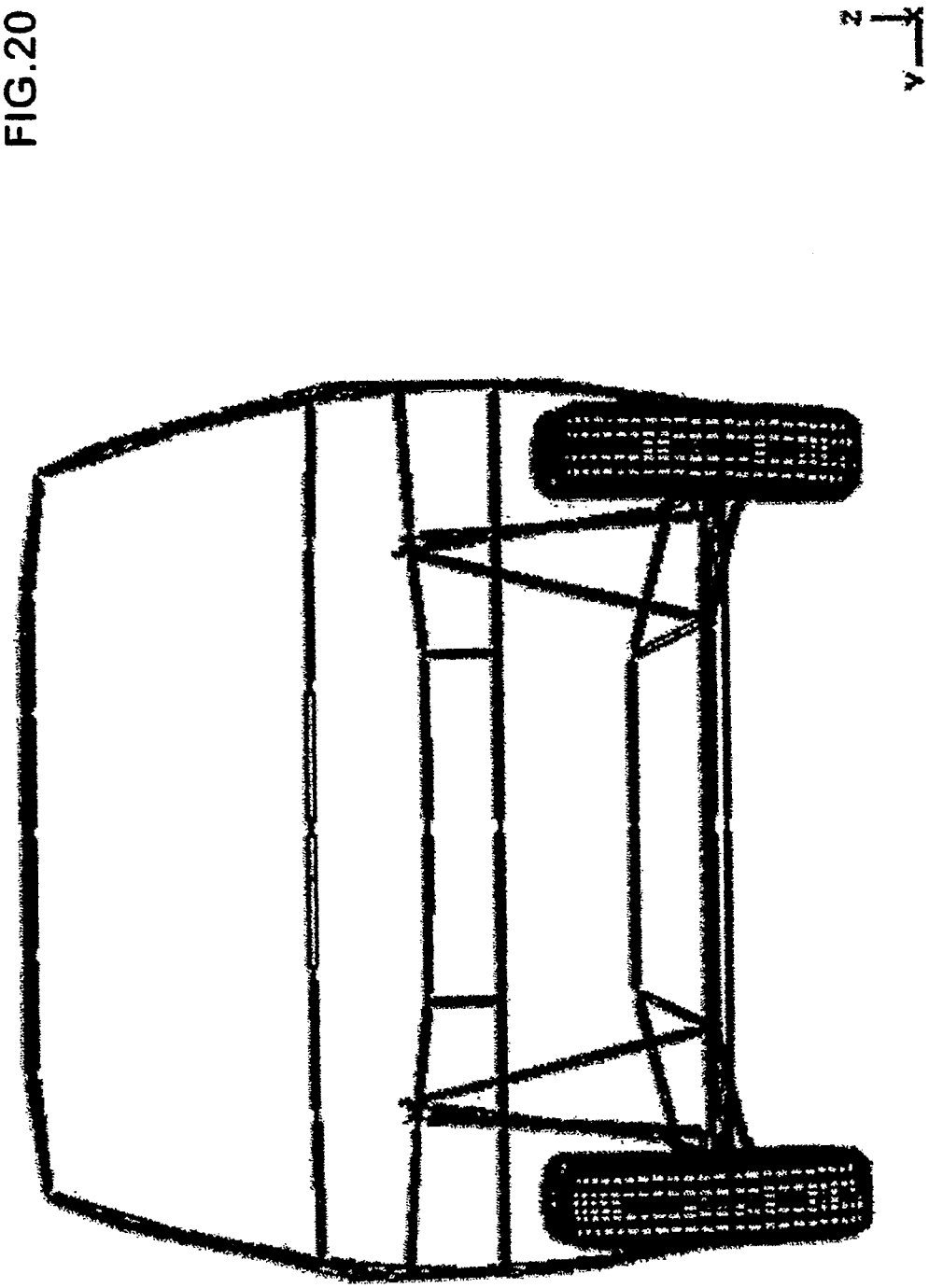
FIG. 20 is a diagram visualizing the vehicle model in the lane change simulation.
Figure 21:
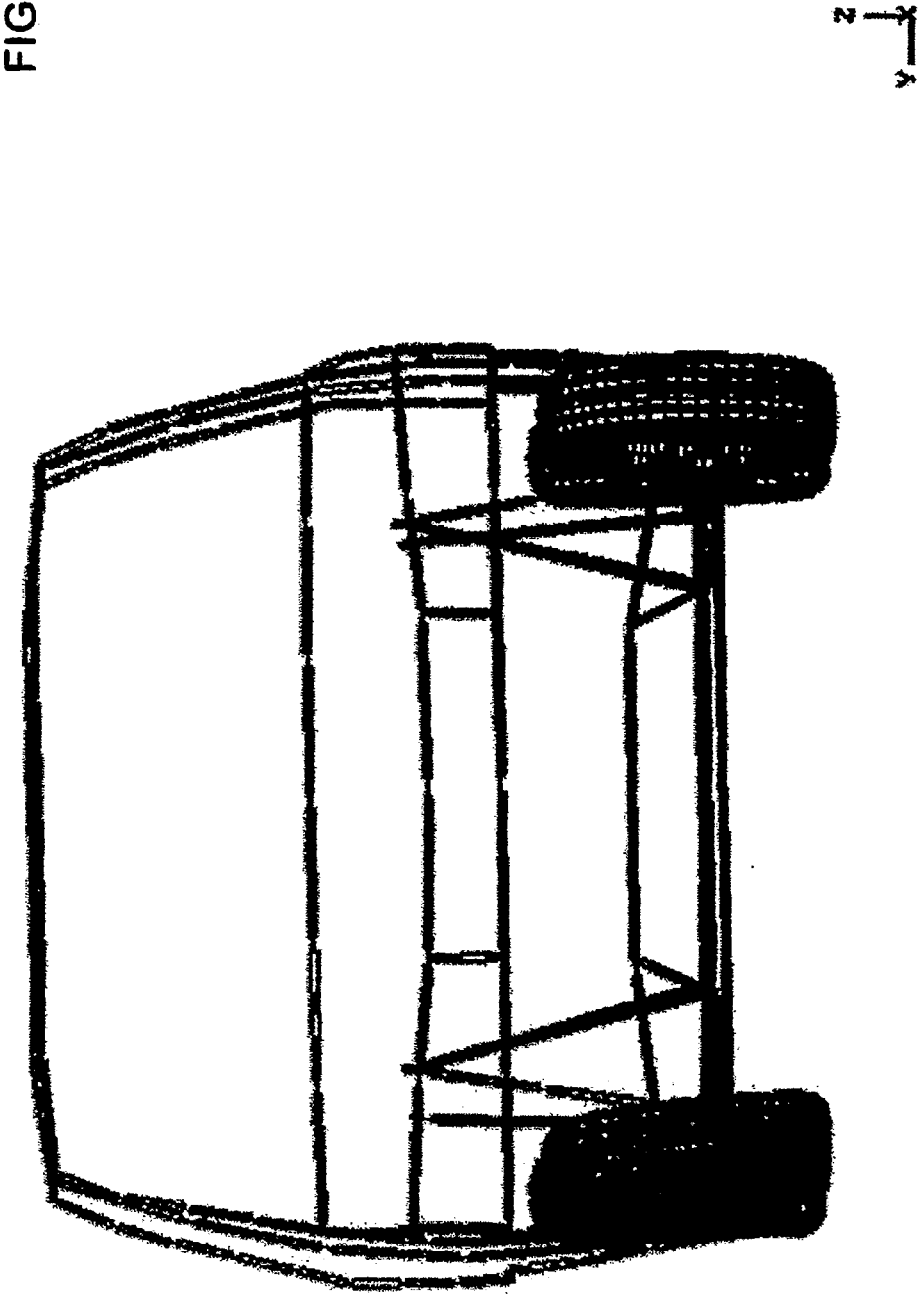
FIG. 21 is a diagram visualizing the vehicle model in the lane change simulation.
Figure 22:
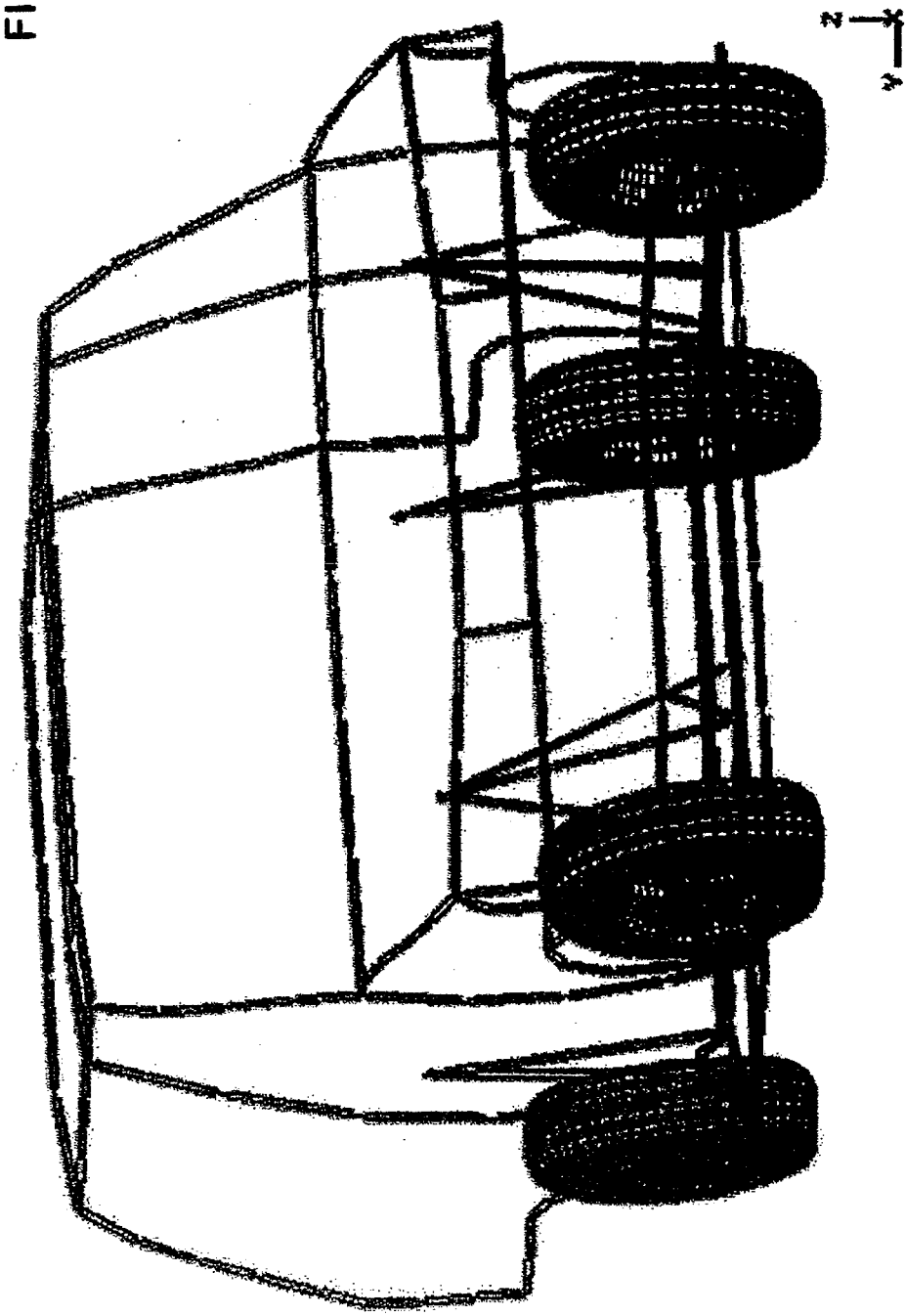
FIG. 22 is a diagram visualizing the vehicle model in the lane change simulation.
Figure 23:
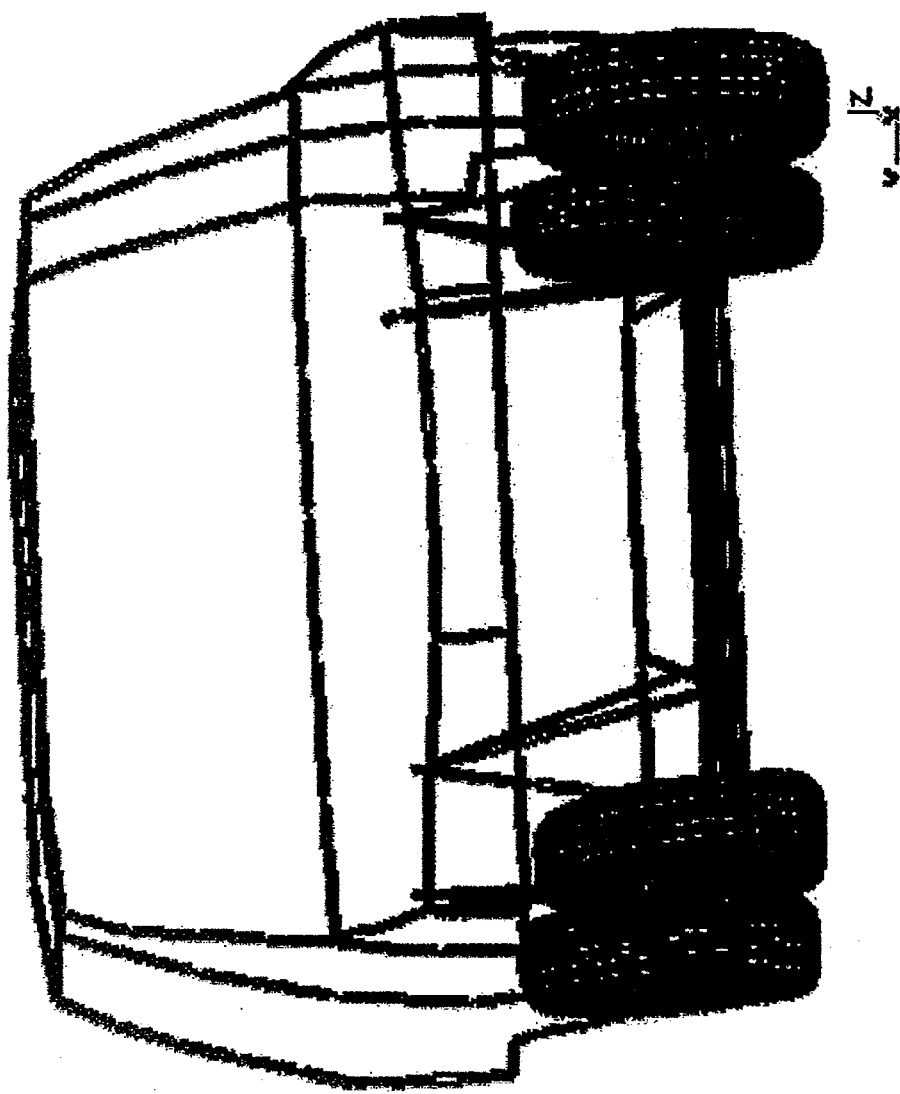
FIG. 23 is a diagram visualizing the vehicle model in the lane change simulation.
Figure 24:
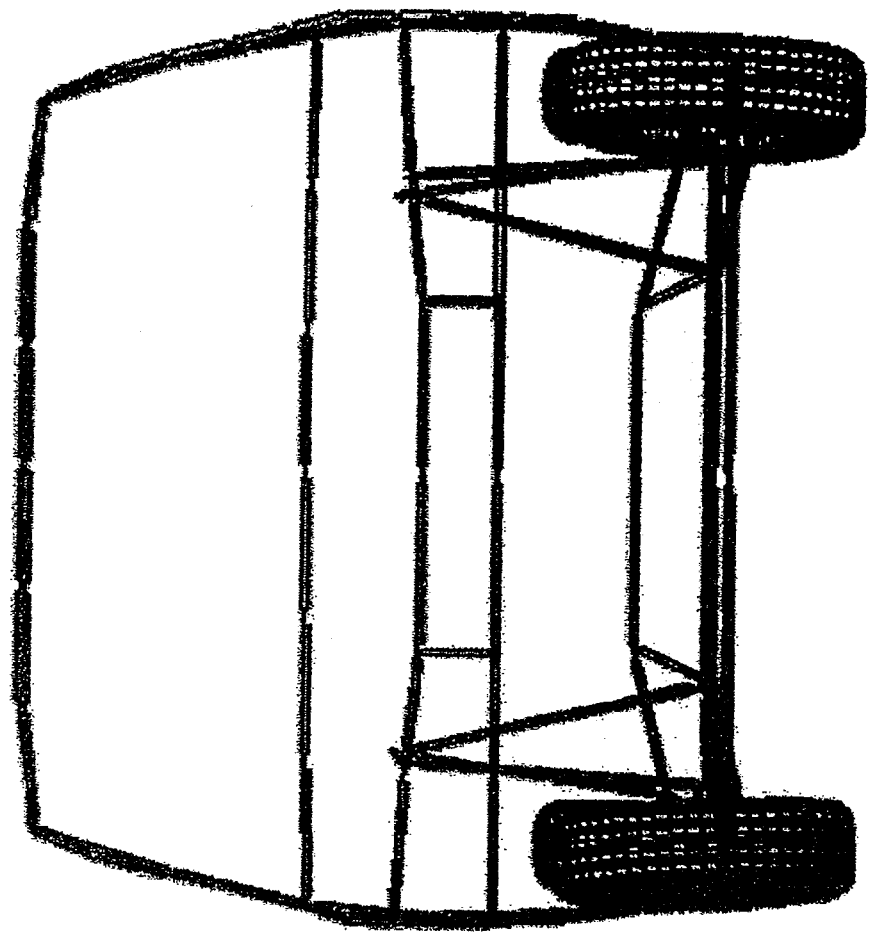
FIG. 24 is a diagram visualizing the vehicle model in the lane change simulation.
Figure 25:
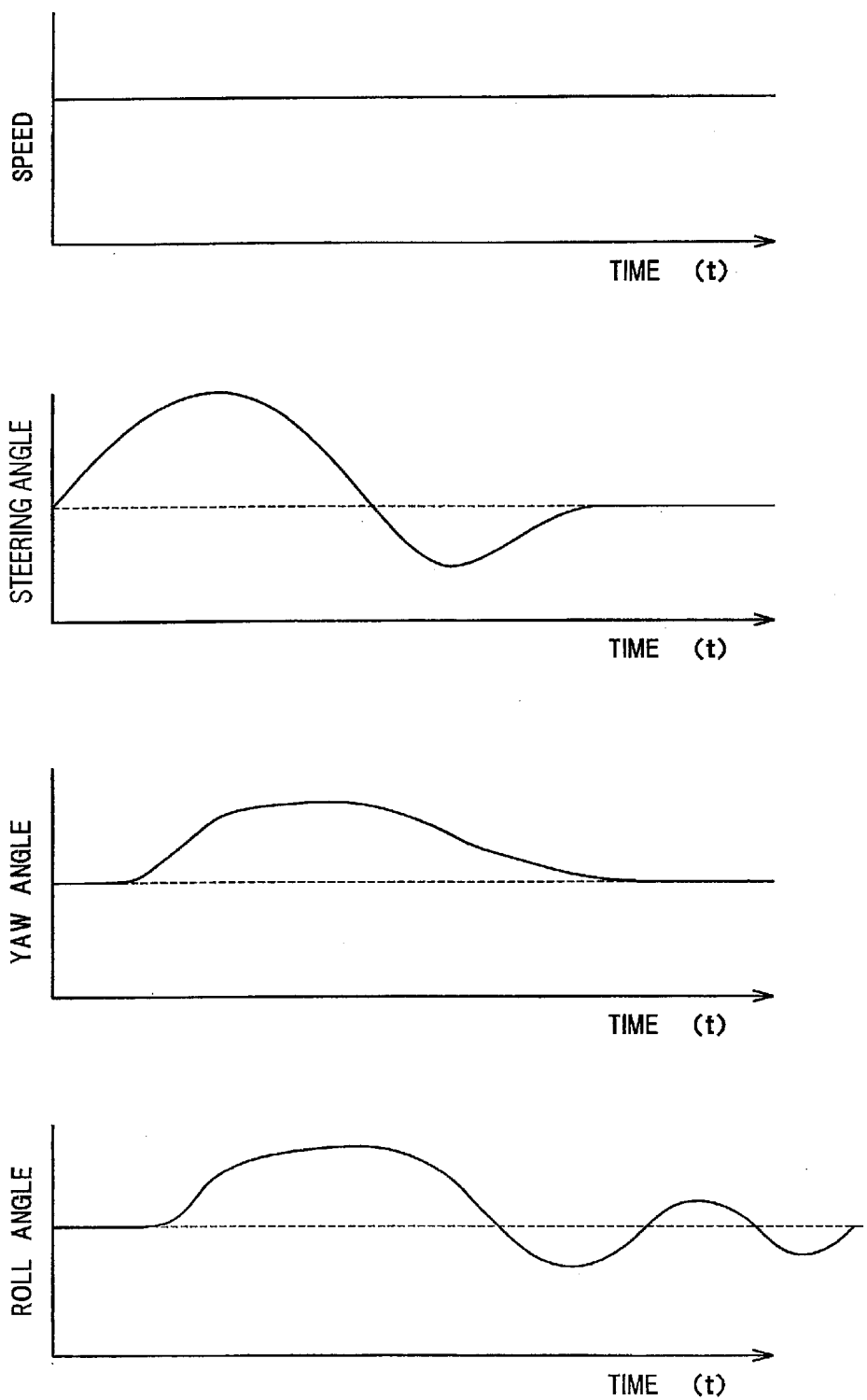
FIG. 25(A) is a graph showing the speed of the vehicle model obtained from the lane change simulation.
FIG. 25(B) is a graph showing the steering angle of the vehicle model obtained from the lane change simulation.
FIG. 25(C) is a graph showing a yaw angle of the vehicle model obtained from the lane change simulation.
FIG. 25(D) is a graph showing a roll angle of the vehicle model obtained from the lane change simulation.

FIGS. 20 to 24 show the visualized vehicle model in the lane change simulation. FIG. 20 shows the vehicle model at an initial traveling stage with the steering angle of zero. FIG. 21 shows the vehicle model 9 immediately after inputting a steering angle, from which it is known that a small roll is caused in the vehicle model. FIG. 22 shows the vehicle model 9 during the lane change, from which it is known that the vehicle body model has a relatively largely roll. FIG. 23 shows a state of the vehicle model at the time of returning the steering angle back to zero. FIG. 24 shows a state of the vehicle model 9 converged after finishing the lane change.

FIGS. 25(A) to (D) show various information obtained from the lane change simulation, wherein (A) shows a relation between the speed of the vehicle model 9 and the time, (B) shows a relation between the steering angle of the vehicle model 9 and the time, (C) shows a relation between a yaw angle of the vehicle model 9 and the time, and (D) shows a relation between the roll angle and the time.

By obtaining the information from the simulation step, it is possible to forecast an approximate lane change motion of the vehicle to be analyzed which is a combination of the vehicle body, suspension and tire.

Furthermore, as another example of the vehicle's traveling properties, a driving force property can be included. In this case, as the traveling simulation, a driving force simulation is executed by giving a fixed torque to the tire model of the vehicle model 9 at rest so as to run on the road model 11.

If the vehicle to be analyzed is a front drive vehicle for example, the driving force can be reproduced by applying a torque to two axles of the front wheels. The magnitude of the torque can be determined from the gear ratio and the number of revolutions of the engine corresponding to the degree of opening of the accelerator throttle defined.

Figure 26:
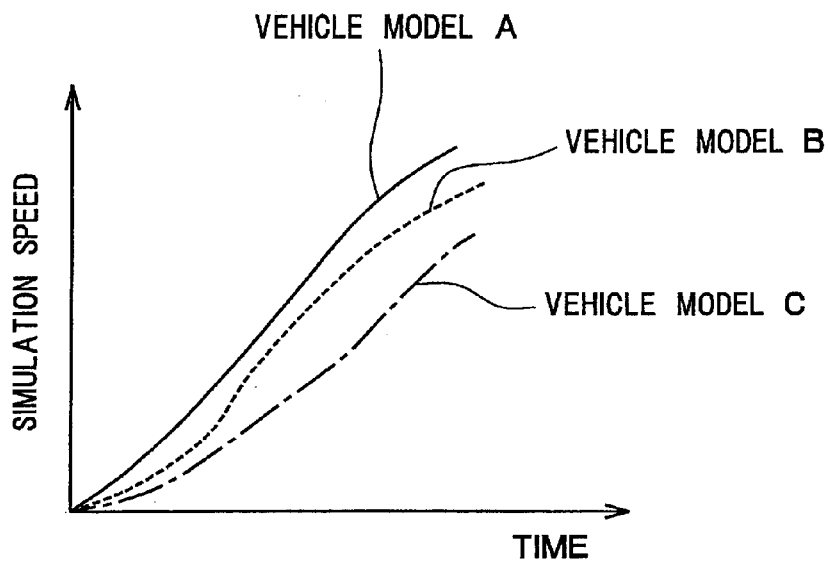
FIG. 26 is a graph showing a relation between the speed and time in the driving force simulation.

As the vehicle is generally provided with a differential gear, in case of straight running, a half of the torque computed from the engine torque is given to each of the right and left front wheels. For example, when the engine torque is T and the gear ratio is r, each of the right and left front wheels is given a torque T×r/2. As shown in FIG. 26, various estimations can be made by using the information relating to the time/speed change obtained from the driving force simulation with respect to the various vehicle models.

Figure 27:
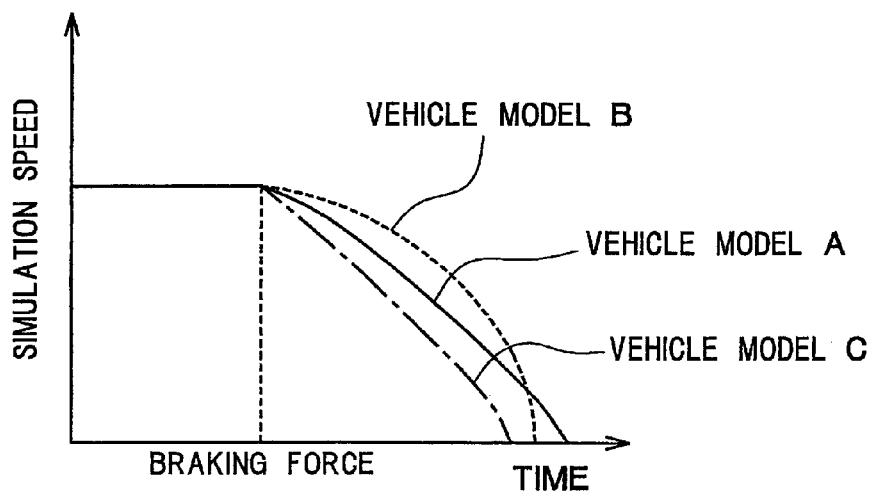
FIG. 27 is a graph showing a relation between the speed and time in the braking force simulation.

Still furthermore, as another example of the vehicle's traveling properties, a braking force property can be included. In this case, as the traveling simulation, a braking force simulation is executed by giving a fixed braking force to the tire model of the traveling vehicle model 9 so as to brake on the road model 11 for example. The four wheels are given the braking force as a torque. The magnitude of the torque is set according to the expected braking force. As shown in FIG. 27, using the information relating to the time/speed change obtained from the braking force simulation, an estimation can be made.

Even if the braking force is constant, the deceleration varies depending on the specifications of the vehicle body, suspension and tire. By executing the braking force simulation, the fitness of the vehicle body, suspension or tire to the subject to be analyzed, can be forecasted.

In the above-mentioned driving force simulation, braking force simulation and the like, it is possible to examine the positional change of the center of gravity of the vehicle model or the like, whereby the behavior at the time of braking and driving can be easily estimated.

As a result of the above-mentioned various traveling simulations, if the target is achieved ("Y" in step s7), it is preferable that an actual tire is made by way of trial according to the appreciated tire model 2 (step s8) and appraised by using an actual car (step s9).

If the target can be also achieved in the actual car test similarly to the simulation ("Y" in step s10), the development of the tire suitable for the vehicle may be finalized.

As described above, in the simulating method for the traveling vehicle/tire in this embodiment, it is possible to consider tires suitable for the vehicle by widely changing various design factors of the tire until the target is achieved in the simulation. Accordingly, in comparison with the conventional developing method in which trial manufacture is repeatedly made, the efficiency can be greatly improved, which helps to decrease the developing time, and it is possible to reduce the cost of the tire.

In case of the simulating method of the present invention, the time for developing a tire suitable for a new vehicle could be shortened by about three month in comparison with the conventional standard period of time.

If the performance of the tire in the actual car test is different from the result of the simulation and does not achieve the target (N in the step s10), then a correction for the simulation is made. In this case, the actual car and model probably do not accurately correspond to each other. In the correcting process, therefore, the actual tire itself and the tire model itself obtained on the basis of the simulation are first compared with each other with respect to the performance (e.g. a cornering performance) to find the correlation therebetween and they are associated with each other.

At this time, according to the finished state of the actual tire, changing of the design factors, setting of the frictional coefficient and the like are made as the items to be corrected so as to feed back to the tire model.

If the performance of the actual tire itself well corresponds to the performance of the tire model itself obtained on the basis of the simulation, then a mismatch exists in the vehicle body model 6. In this case, the weight, position of the center of gravity, suspension spring coefficient and the like of the vehicle body model 6 are appropriately corrected, and associating with the actual measurements are made based on the correlation.

As described above, as the actual car test results are fed back to the simulation results, it is possible to further increase the accuracy of the simulation results in the next time or later and it becomes possible to improve a reliability of the simulation.

Industrial Applicability

As described above, in the simulating method for the vehicle/tire performances according to the present invention, since the fitness of a tire for a vehicle can be estimated without actually manufacturing trial tires, the developing efficiency is greatly improved, which helps to shorten the developing time. Further, since the tire model includes the ply, it is possible to obtain highly reliable simulation results and a high-level analysis can be made. In particular, since the tire model includes the ply and the vehicle body model includes the suspension model, highly accurate analysis results can be obtained.

What is claimed is:

1. A simulating method for vehicle/tire performances which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle, wherein said suspension members are modeled by at least one rigid beam element, at least one linear or non-linear spring element, and at least one torsional beam element.

2. A simulating method for vehicle/tire performances according to claim 1, wherein traveling properties of said vehicle include at least one of the degree of understeer/oversteer, a vehicle response speed to steering, and the degree of roll.

3. A simulating method for vehicle/tire performances according to claim 1 or 2, characterized in that wherein said suspension members include an arm, a spring, a shock absorber, a torsion beam, a stabilizer, a link rod and a rubber bushing, said arm and link rod are each modeled by a rigid beam element, said spring, shock absorber and rubber bushing are each modeled by a linear or non-linear spring element, and said torsion beam and stabilizer are each modeled by a torsional beam element.

4. A simulating method for vehicle/tire performances according to claim 1 or 2, one of a traveling property of said vehicle is a vehicle body vibrating property under 10 Hz, and the vehicle body model except said suspension model is a rigid model which does not deform.

5. A simulating method for vehicle/tire performances according to claim 1 or 2, wherein traveling properties of said vehicle include a vehicle body vibrating property in a range of more than 10 Hz and not more than 100 Hz, and said vehicle body model is provided with a vibration mode substantially corresponding to a vibration mode of the vehicle body to be estimated.

6. A simulating method for vehicle/tire performances according to claim 1 or 2, wherein said traveling simulation is made by running said vehicle model on a road model of a road surface made out of elements.

7. A simulating method for vehicle/tire performances according to claim 6, wherein said road model is made out of a rigid element and a water element for water provided thereon, and traveling properties of said vehicle include a wet traveling property.

8. A simulating method for vehicle/tire performances according to claim 1 or 2, wherein said vehicle model preparing step implies a step of providing an internal pressure condition to the tire model under a gravitational condition of 0 G, and a step of applying the load of the vehicle body model to the tire model by setting the gravitational condition to 1 G after providing said internal pressure condition is provided.

9. A simulating method for vehicle/tire performances according to claim 1 or 2, wherein in the simulation step, the vehicle model has an initial speed which is not zero.

10. A simulating method for vehicle/tire performances according to claim 1 or 2, wherein said traveling simulation includes a braking simulation in which a fixed braking force is applied to the tire model and change in the speed of the vehicle model, and wherein traveling properties of said vehicle include a braking force property.

11. A simulation apparatus comprising a computer for executing the method as set forth in claim 1 or 2.

12. A simulating method for vehicle/tire performances which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle, wherein said suspension members are modeled by at least one rigid beam element, at least one linear or non-linear spring element, and at least one torsional beam element;

wherein said traveling simulation is made by running said vehicle model on a road model of a road surface made out of elements, wherein said road model is made out of a rigid element and a snow element for snow provided thereon, and wherein traveling properties of said vehicle include an on-the-snow traveling property.

13. A simulating method for vehicle/tire performances, which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle, wherein said suspension members are modeled by at least one rigid beam element, at least one linear or non-linear spring element, and at least one torsional beam element;

wherein said traveling simulation is made by running said vehicle model on a road model of a road surface made out of elements, wherein said road model is made out of a rigid element and a mud element for mud provided thereon, and traveling properties of said vehicle include a muddy terrain traveling property.

14. A simulating method for vehicle/tire performance which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle, wherein said suspension members are modeled by at least one rigid beam element, at least one linear or non-linear spring element, and at least one torsional beam element;

wherein said traveling simulation is made by running said vehicle model on a road model of a road surface made out of elements, wherein said road model is made out of a rigid element and a sand element for sand provided thereon, and wherein traveling properties of said vehicle include a sandy terrain traveling property.

15. A simulating method for vehicle/tire performances which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle, wherein said suspension members are modeled by at least one rigid beam element, at least one linear or non-linear spring element, and at least one torsional beam element;

wherein said traveling simulation is made by running said vehicle model on a road model of a road surface made out of elements, wherein said road model comprises an uneven portion, and wherein traveling properties of said vehicle include a ride comfort property.

16. A simulating method for vehicle/tire performances, which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle, wherein said suspension members are modeled by at least one rigid beam element, at least one linear or non-linear spring element, and at least one torsional beam element, wherein in the simulation step, the vehicle model has an initial speed which is not zero, wherein said vehicle body model is provided with a speed corresponding to a translational component of the initial speed and wherein said tire model is provided with a speed corresponding to said translational component of the initial speed and a speed corresponding to a rotational component.

17. A simulating method for vehicle/tire performances, which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle, wherein said suspension members are modeled by at least one rigid beam element, at least one linear or non-linear spring element, and at least one torsional beam element wherein said traveling simulation includes a steady circling simulation in which steady circling is made with the tire model having a certain fixed steering angle, and traveling properties of said vehicle include a steering property estimated by a turning radius of the vehicle model and/or a roll angle of the vehicle model which are obtained from the steady circling simulation.

18. A simulating method for vehicle/tire performances, which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle, wherein said suspension members are modeled by at least one rigid beam element, at least one linear or non-linear spring element, and at least one torsional beam element;

wherein said traveling simulation includes a lane change simulation in which a lane change state is simulated, and wherein traveling properties of said vehicle include a lane change property estimated by a behavior of the vehicle model and/or a convergence of the vehicle model when the steering angle is returned back which are obtained from the lane change simulation.

19. A simulating method for vehicle/tire performances, which comprises:

a tire model preparing step of preparing a tire model of a tire including a ply made out of a finite number of elements;

a vehicle body model preparing step of preparing a vehicle body model of a vehicle body including suspension members made out of a finite number of elements;

a vehicle model preparing step of preparing a vehicle model by attaching said tire model to a suspension model of said suspension members in the vehicle body model; and a simulation step of executing a simulation of traveling of said vehicle model by setting a boundary condition so as to obtain traveling properties and/or a tire property of said vehicle;

wherein said suspension members are modeled by at least one rigid beam element, at least one linear or non-linear spring element, and at least one torsional beam element;

wherein said traveling simulation includes a driving simulation in which a fixed torque is applied to the tire model and a change in the speed of the vehicle model is observed, and wherein traveling properties of said vehicle include a driving force property.

* * * * *